(12) United States Patent
Mino et al.

(10) Patent No.: US 12,009,586 B2
(45) Date of Patent: Jun. 11, 2024

(54) CONDUCTIVE DEVICE, METHOD FOR PRODUCING CONDUCTIVE DEVICE, AND RADIO

(71) Applicant: Panasonic Intellectual Property Management Co., Ltd., Osaka (JP)

(72) Inventors: Takuya Mino, Osaka (JP); Takanori Aketa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 427 days.

(21) Appl. No.: 17/429,144

(22) PCT Filed: Feb. 6, 2020

(86) PCT No.: PCT/JP2020/004471
§ 371 (c)(1),
(2) Date: Aug. 6, 2021

(87) PCT Pub. No.: WO2020/162521
PCT Pub. Date: Aug. 13, 2020

(65) Prior Publication Data
US 2022/0013892 A1    Jan. 13, 2022

(30) Foreign Application Priority Data

Feb. 8, 2019    (JP) .................................. 2019-021902

(51) Int. Cl.
*H05K 1/09*    (2006.01)
*H01Q 1/24*    (2006.01)
(Continued)

(52) U.S. Cl.
CPC ................. *H01Q 1/38* (2013.01); *H01Q 1/24* (2013.01); *H05K 1/092* (2013.01); *H05K 3/12* (2013.01); *H05K 3/28* (2013.01)

(58) Field of Classification Search
CPC ........... H05K 1/0292; H05K 3/12; H05K 3/28
See application file for complete search history.

(56) References Cited

U.S. PATENT DOCUMENTS

| 2002/0080076 A1 | 6/2002 | Kamei et al. |
| 2008/0083698 A1 | 4/2008 | Jung et al. |

(Continued)

FOREIGN PATENT DOCUMENTS

| JP | 04-241489 | 8/1992 |
| JP | 05-121924 | 5/1993 |

(Continued)

OTHER PUBLICATIONS

Official Communication issued in International Patent Application No. PCT/JP2020/004471, dated Mar. 24, 2020, along with an English translation thereof.

*Primary Examiner* — Jeremy C Norris
(74) *Attorney, Agent, or Firm* — GREENBLUM & BERNSTEIN, P.L.C.

(57) ABSTRACT

The conductive device includes a substrate and an electrically conductive portion. The electrically conductive portion is provided on the substrate. The electrically conductive portion includes an electrically conductive part and a low resistance conductive layer. The electrically conductive part is provided on the substrate and includes an electrically conductive particle and an organic binder. The low resistance conductive layer covers at least part of a surface of the electrically conductive part and has lower resistivity than the electrically conductive part.

15 Claims, 21 Drawing Sheets

(51) Int. Cl.
*H01Q 1/38* (2006.01)
*H05K 3/12* (2006.01)
*H05K 3/28* (2006.01)

(56) References Cited

U.S. PATENT DOCUMENTS

| | | |
|---|---|---|
| 2010/0055396 A1 | 3/2010 | Kim et al. |
| 2012/0183741 A1 | 7/2012 | Kim et al. |
| 2018/0035536 A1* | 2/2018 | Matsumura .......... H05K 1/0283 |

FOREIGN PATENT DOCUMENTS

| | | |
|---|---|---|
| JP | 2003-152428 | 5/2003 |
| JP | 2005-183682 | 7/2005 |
| JP | 2008-085345 | 4/2008 |
| JP | 2010-511905 | 4/2010 |
| JP | 2013-164990 | 8/2013 |
| JP | 2014-049721 | 3/2014 |
| JP | 2018-018898 | 2/2018 |

\* cited by examiner

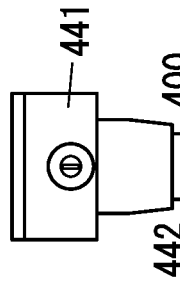
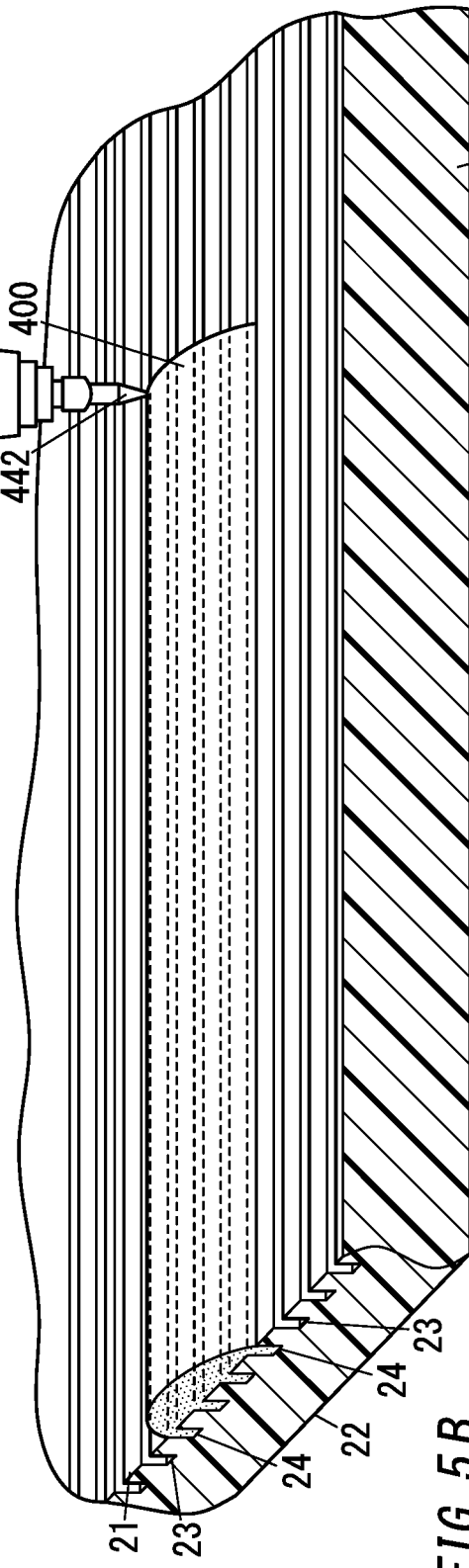
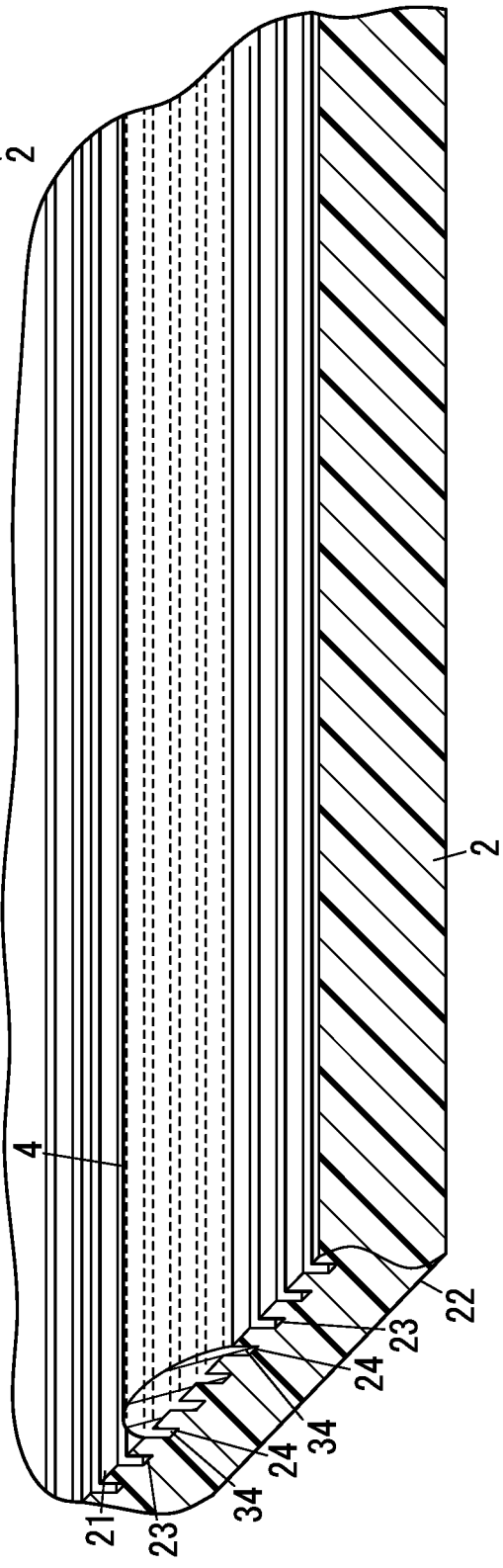
FIG. 5A
FIG. 5B

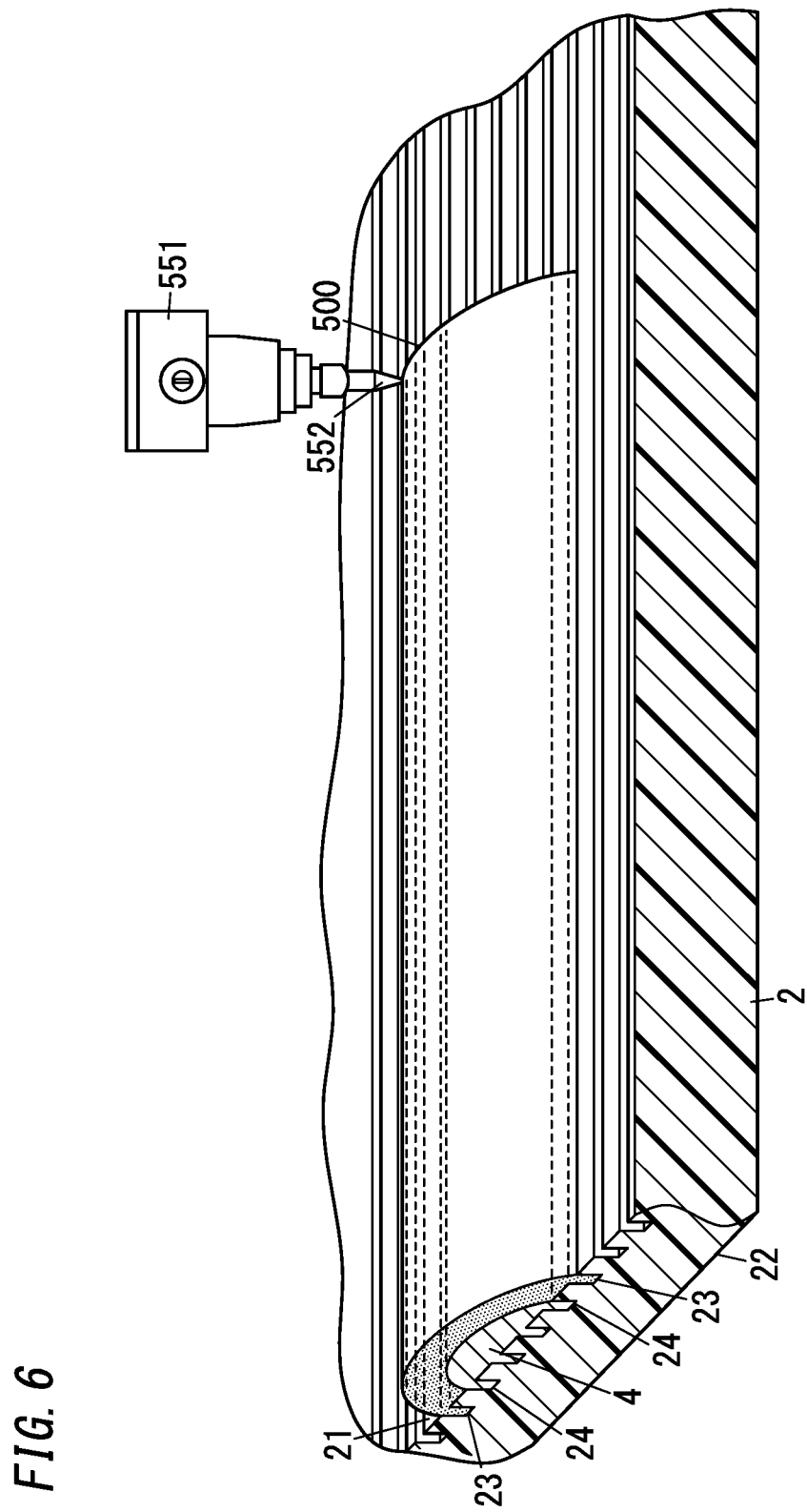

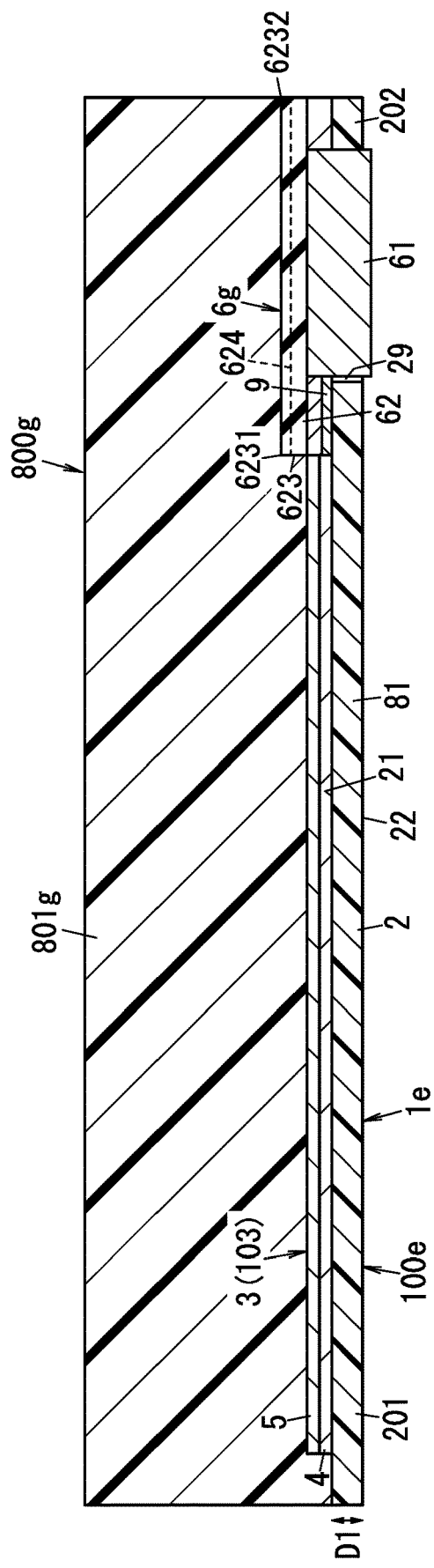
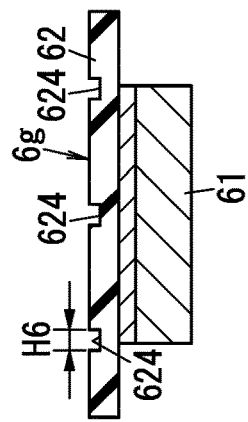
FIG. 18A
FIG. 18B

CONDUCTIVE DEVICE, METHOD FOR PRODUCING CONDUCTIVE DEVICE, AND RADIO

CROSS-REFERENCE TO RELATED APPLICATIONS

This application is a National Stage of International Application No. PCT/JP2020/004471 filed Feb. 6, 2020, claiming priority to Japanese Patent Application No. 2019-021902 filed Feb. 8, 2019, the contents of both applications are incorporated herein by reference in their entirety.

TECHNICAL FIELD

The present disclosure generally relates to conductive devices, methods for producing the conductive devices, and radios, and specifically, to a conductive device including a substrate and an electrically conductive part, a method for producing the conductive device including the substrate and the electrically conductive part, and a radio including an antenna device.

BACKGROUND ART

A known example of conductive devices is, for example, an electrode including a base member and an electrically conductive part formed on the base member, wherein the electrically conductive part is made of a conductive composition containing a thermoplastic resin, a thermosetting resin, a hardener, and metal particles (Patent Literature 1).

Also in the electrode described in Patent Literature 1, it is in some cases desirable to reduce the resistance of an electrically conductive portion of the electrode.

CITATION LIST

Patent Literature

Patent Literature 1: JP 2013-164990 A

SUMMARY OF INVENTION

An object of the present disclosure is to provide a conductive device including an electrically conductive portion having reduced resistance, a method for producing the conductive device, and a radio.

A conductive device of one aspect according to the present disclosure includes a substrate and an electrically conductive portion. The electrically conductive portion is provided on the substrate. The electrically conductive portion includes an electrically conductive part and a low resistance conductive layer. The electrically conductive part is provided on the substrate and includes an electrically conductive particle and an organic binder. The low resistance conductive layer covers at least part of a surface of the electrically conductive part and has lower resistivity than the electrically conductive part.

A method for producing a conductive device of another aspect according to the present disclosure is a method for producing the conductive device of the one aspect. The method for producing the conductive device includes: a substrate preparation step of preparing the substrate; an application step of applying conductive paste in a formation target area of the electrically conductive part on the substrate, the conductive paste including the electrically conductive particle, the organic binder, and a solvent; a thermally curing step of heating the conductive paste to form the electrically conductive part; and a low resistance conductive layer forming step of forming the low resistance conductive layer on the surface of the electrically conductive part.

A radio of still another aspect according to the present disclosure includes the conductive device as an antenna device.

BRIEF DESCRIPTION OF DRAWINGS

FIG. 5A is a view illustrating a step of applying conductive paste in the method for producing the conductive device;
FIG. 5B is a view illustrating a step of forming an electrically conductive part in the method for producing the conductive device;
FIG. 6 is a view illustrating a step of applying conductive ink in the method for producing the conductive device;
FIG. 18A is a sectional view of a radio according to a second variation of the third embodiment;
FIG. 18B is a sectional view illustrating a connection terminal used for the radio according to the second variation of the third embodiment.

DESCRIPTION OF EMBODIMENTS

Figure 1:
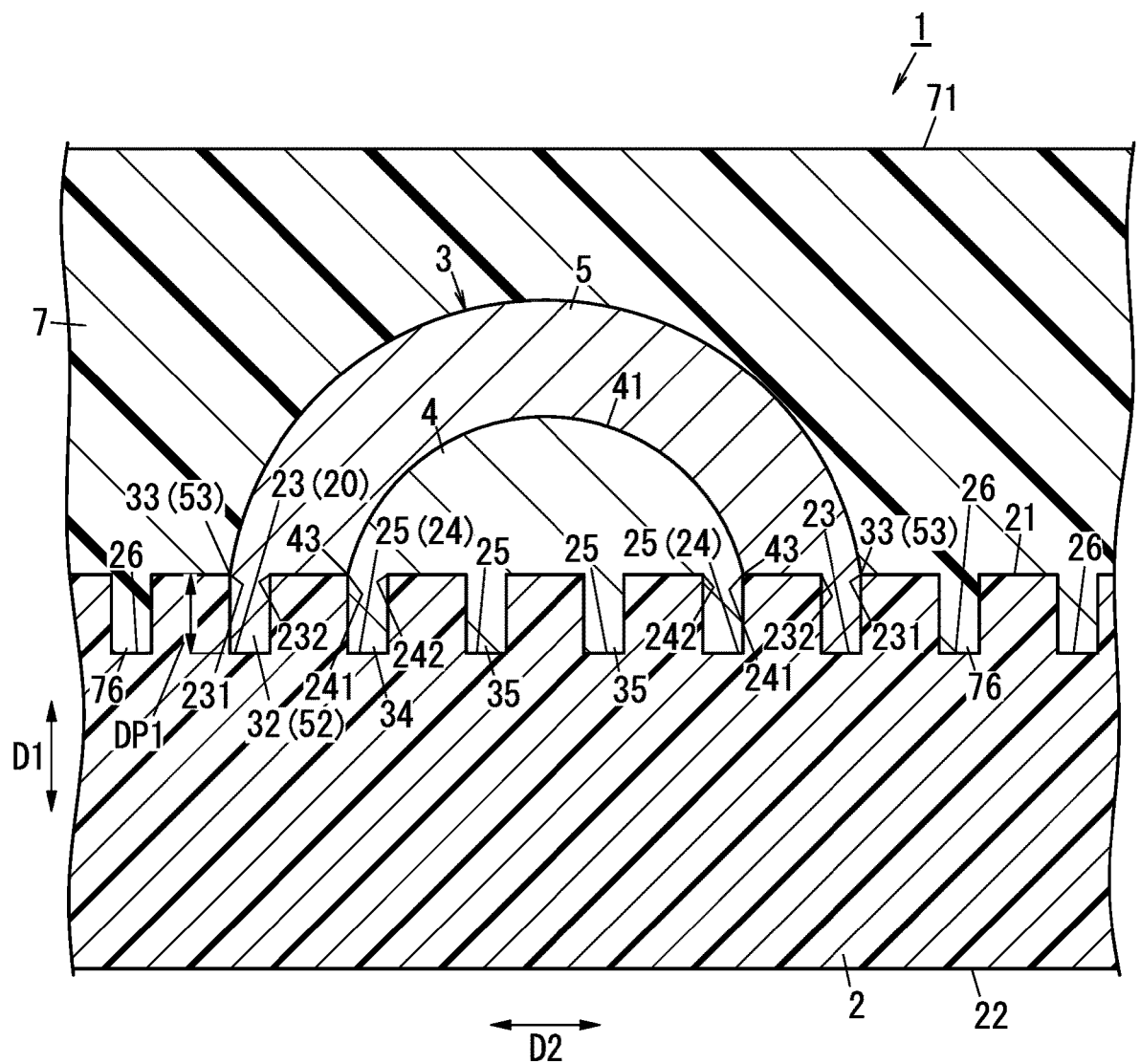
FIG. 1 is a sectional view orthogonal to a longitudinal direction of an electrically conductive portion of a conductive device according to a first embodiment.

FIGS. 1 to 21B described in the following embodiments and the like are schematic views, and the ratio of sizes and the ratio of thicknesses of components in the figures do not necessarily reflect actual dimensional ratios.

First Embodiment (1) Schema

A conductive device 1 according to a first embodiment will be described below with reference to FIGS. 1 to 4.

The conductive device 1 includes a substrate 2 and an electrically conductive portion 3. The electrically conductive portion 3 is provided on the substrate 2. The electrically conductive portion 3 overlaps part of the substrate 2 in a thickness direction D1 of the substrate 2. The electrically conductive portion 3 includes an electrically conductive part 4. The electrically conductive portion 3 further includes a low resistance conductive layer 5. The conductive device 1 further includes a protecting sheet 7. The protecting sheet 7 is stacked on the substrate 2 to cover the electrically conductive portion 3.

(2) Components of Conductive Device

Next, components of the conductive device 1 will be described with reference to the drawings.

(2.1) Substrate

The substrate 2 has a first principal surface 21 and a second principal surface 22 on an opposite side of the first principal surface 21.

The substrate 2 is, for example, a flexible substrate and has flexibility. The thickness of the substrate 2 is, for example, greater than or equal to 30 μm and less than or equal to 200 μm. The substrate 2 has a thickness of, for example, 50 μm. The substrate 2 is, for example, a plastic film The plastic film is, but not limited to, a polyethylene terephthalate film and may be, for example, an ABS film, a polyethylene naphthalate film, a polyether sulfone film, a polycarbonate film, a polyester film, or the like. The substrate 2 is not limited to the plastic film but may be, for example, an inorganic substrate. Examples of the inorganic substrate include a glass substrate and a piezoelectric substrate.

Figure 4:
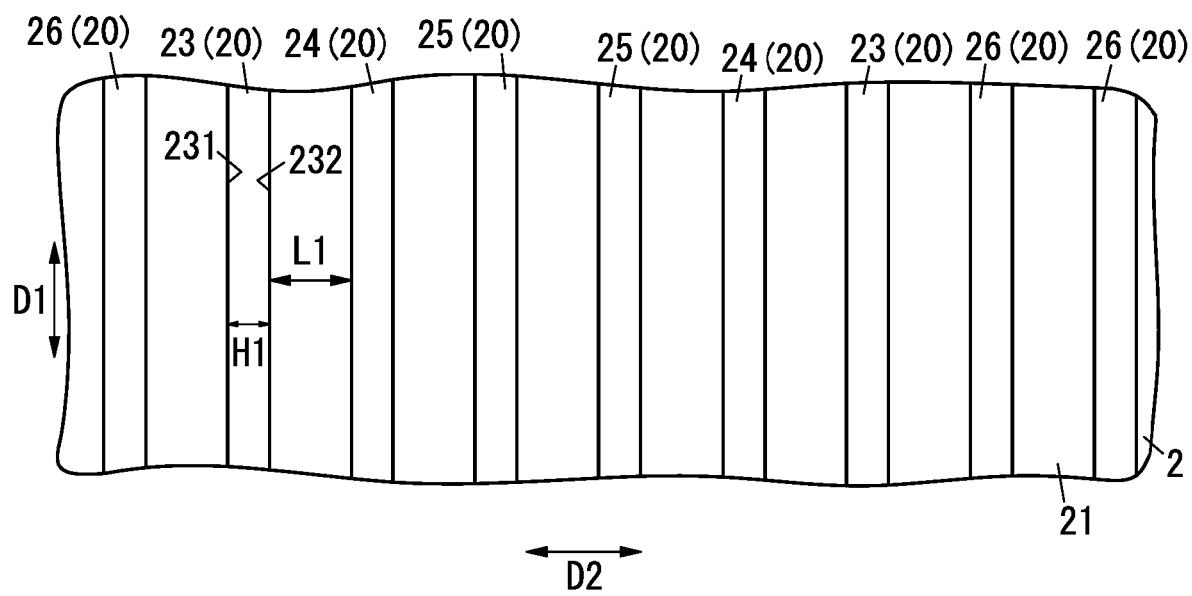
FIG. 4 is a partially cutaway plan view illustrating a substrate prepared in a method for producing the conductive device.

The first principal surface 21 of the substrate 2 has a plurality of grooves 20 (see FIG. 4). The plurality of grooves 20 are aligned, for example, at regular intervals, but this should not be construed as limiting. The plurality of grooves 20 may be aligned, for example, at irregular intervals. Each groove 20 has a depth DP1 of, for example, 5 μm to 10 μm. Moreover, each groove 20 has an opening width H1 (see FIG. 4) of, for example, 5 μm to 10 μm in a width direction thereof. Moreover, a distance L1 (see FIG. 4) between the adjacent grooves 20 is, for example, 10 μm to 30 μm. Note that the plurality of grooves 20 may have the same length or may have different lengths. Moreover, the plurality of grooves 20 have, but do not have to have, a straight-line shape and may have, for example, a curved line shape or an annular shape. Moreover, each of the plurality of grooves 20 is, but not limited to, a U-shaped groove in a cross-sectional view of the substrate 2 orthogonal to a length direction thereof and may be, for example, a V-shaped groove in the cross-sectional view of the substrate 2.

The plurality of grooves 20 include grooves 23 (hereinafter referred to also as first grooves 23) which overlap the electrically conductive portion 3 in plan view in the thickness direction D1 of the substrate 2 and which are along edges 33 of the electrically conductive portion 3. The first grooves 23 are formed to extend along the edges 33 of the electrically conductive portion 3. Formation locations of the first grooves 23 are, for example, defined such that in plan view in the thickness direction D1 of the substrate 2, each edge 33 of the electrically conductive portion 3 overlaps an opening edge 231 which is one of a pair of opening edges 231 and 232 in a width direction D2 of a corresponding one of the first grooves 23, the opening edge 231 being closer to a corresponding one of the edges 33 of the electrically conductive portion 3 than the opening edge 232 is.

The plurality of grooves 20 include a plurality of grooves 25 (hereinafter referred to also as second grooves 25) formed at locations overlapping an inner side portion of the edges 33 of the electrically conductive portion 3 in plan view in the thickness direction D1 of the substrate 2. The second grooves 25 are along the same direction as the first grooves 23 in plan view in the thickness direction D1 of the substrate 2. In this embodiment, the second grooves 25 are, for example, parallel to the first grooves 23 in plan view in the thickness direction D1 of the substrate 2. Moreover, the plurality of grooves 20 include grooves 24 (hereinafter referred to also as third grooves 24) which overlap the electrically conductive part 4 in plan view in the thickness direction D1 of the substrate 2 and which are along edges 43 of the electrically conductive part 4. The third grooves 24 are included in the plurality of second grooves 25. Formation locations of the third grooves 24 are, for example, defined such that in plan view in the thickness direction D1 of the substrate 2, each edge 43 of the electrically conductive part 4 overlaps an opening edge 241 which is one of a pair of opening edges 241 and 242 in a width direction of a corresponding one of the third grooves 24, the opening edge 241 being closer to a corresponding one of the edges 43 of the electrically conductive part 4 than the opening edge 242.

Moreover, the plurality of grooves 20 include a plurality of recess 26 formed in areas which only the protecting sheet 7 of the protecting sheet 7 and the electrically conductive portion 3 overlaps in plan view in the thickness direction D1 of the substrate 2.

Note that the substrate 2 of the conductive device 1 does not have to have the plurality of grooves 20, but the substrate 2 of the conductive device 1 has at least the grooves 23 of the plurality of grooves 20.

The substrate 2 is, but does not have to be, formed by an imprinting method and may be formed by, for example, a molding method.

(2.2) Electrically Conductive Portion

The electrically conductive portion 3 is formed on the substrate 2 and is in close contact with the substrate 2. The electrically conductive portion 3 includes the electrically conductive part 4 and the low resistance conductive layer 5. The electrically conductive portion 3 has, for example, a line shape in plan view in the thickness direction D1 of the substrate 2. In this embodiment, the shape of the electrically conductive portion 3 is a semicircular shape in a cross section orthogonal to a length direction of the electrically conductive portion 3.

The electrically conductive part 4 is formed on the substrate 2. The electrically conductive part 4 has, for example, a line shape narrower than the electrically conductive portion 3 in plan view in the thickness direction D1 of the substrate 2. In this embodiment, the shape of the electrically conductive part 4 is a semicircular shape in a cross section orthogonal to a length direction of the electrically conductive part 4.

The electrically conductive part 4 has stretchability. In this embodiment, the electrically conductive part 4 is more stretchable than, for example, a copper foil, a plating layer, and the like. The electrically conductive part 4 is made of conductive paste 400 (see FIG. 5A). The electrically conductive part 4 includes electrically conductive particles 410 (see FIG. 3) and an organic binder 420 (see FIG. 3). The electrically conductive particles 410 are, but not limited to, metal particles and may be, for example, metal compound particles. The conductive paste 400 is, for example, silver paste but is not limited to this example. Alternatively, the conductive past 400 may be copper paste. When the conductive paste 400 is the silver paste, the electrically conductive particles 410 are, for example, silver particles. When the conductive paste 400 is the copper paste, the electrically conductive particles 410 are copper particles.

The shape of the electrically conductive particles 410 is, for example, a scale-like shape but is not limited to this example. Alternatively, the electrically conductive particles 410 may have, for example, a spherical shape. The average particle diameter of the electrically conductive particles 410 is, for example, 1 µm to 4 µm. The average particle diameter of the electrically conductive particles 410 is, for example, a value calculated based on a particle size value of the electrically conductive particles 410. The particle size value is obtained by observing a cross section of a sample obtained by cutting the electrically conductive part 4 along the thickness direction D1 of the substrate 2 with a Scanning Electron Microscope (SEM) to obtain a cross-sectional SEM image and subjecting the cross-sectional SEM image to an image process. The "particle size value" is the diameter of a circle having the same surface area as the area of the electrically conductive particles 410 obtained from the cross-sectional SEM image. The "average particle diameter" is the average value of the particle size values of the prescribed number of (e.g., 50) electrically conductive particles 410. In discussions about the relative magnitude relationship of the average particle diameter, the average particle diameter is not limited to the average value described above but may be, for example, a median diameter ($d_{50}$) obtained from a particle size distribution curve based on the number of particles. The particle size distribution curve based on the number of particles is obtained by measuring particle size distribution by an imaging method. Specifically, the particle size distribution curve based on the number of particles is a curve obtained from the size (two-dimensional average diameter) and the number of electrically conductive particles 410 obtained by subjecting the SEM image described above to the image process. In the particle size distribution curve based on the number of particles, a particle size value at an integrated value of 50% is referred to as a median diameter ($d_{50}$).

The organic binder 420 is, for example, an acrylic resin, polyethylene, polypropylene, polyethylene terephthalate, polymethyl methacrylate, polystyrene, polyether sulfone, polyarylate, polycarbonate resin, polyurethane, polyacrylonitrile, polyvinyl acetal, polyamide, polyimide, a diacryl phthalate resin, cellulose-based resin, polyvinyl chloride, polyvinylidene chloride, polyvinyl acetate, other thermoplastic resins, or a copolymer of two or more kinds of monomers constituting these resins.

The low resistance conductive layer 5 is stacked on, for example, the entirety of a surface 41 of the electrically conductive part 4. The surface 41 of the electrically conductive part 4 is a surface of the electrically conductive part 4 which is not in contact with the substrate 2. The low resistance conductive layer 5 has a line shape wider than, for example, the electrically conductive part 4 in plan view in the thickness direction D1 of the substrate 2. In this embodiment, the shape of the low resistance conductive layer 5 is an arc-like shape in a cross section orthogonal in a length direction of the low resistance conductive layer 5.

The low resistance conductive layer 5 is formed of conductive ink 500 (see FIG. 6). The low resistance conductive layer 5 is a sintered metal layer containing a plurality of conductive nanoparticles. The sintered metal layer is a sintered body obtained by bonding the conductive nanoparticles to each other by sintering. The sintered metal layer is porous metal. Thus, the low resistance conductive layer 5 is more stretchable than a copper foil, a plating layer, and the like.

Each conductive nanoparticle has, for example, a spherical shape. The average particle diameter of the conductive nanoparticles is smaller than the average particle diameter of the electrically conductive particles 410. The average particle diameter of the conductive nanoparticles is, for example, 10 nm to 300 nm. The average particle diameter of the conductive nanoparticles is, for example, a value calculated based on a particle size value of the conductive nanoparticles. The particle size value is obtained by observing a cross section of a sample obtained by cutting the low resistance conductive layer 5 along the thickness direction D1 of the substrate 2 with a Transmission Electron Microscope (TEM) to obtain a cross-sectional TEM image and subjecting the cross-sectional TEM image to an image process. The "particle size value" is the diameter of a circle having the same surface area as the area of the conductive nanoparticles obtained from the cross-sectional TEM image. The "average particle diameter" is the average value of the particle size value of the prescribed number of (e.g., 50) conductive nanoparticles. In discussions about the relative magnitude relationship of the average particle diameter, the average particle diameter is not limited to the average value described above but may be, for example, a median diameter ($d_{50}$) obtained from a particle size distribution curve based on the number of particles. The particle size distribution curve based on the number of particles is obtained by measuring particle size distribution by an imaging method. Specifically, the particle size distribution curve based on the number of particles is a curve obtained from the size (two-dimensional average diameter) and the number of conductive nanoparticles obtained by subjecting the TEM image described above to the image process. In the particle size distribution curve based on the number of particles, a particle size value at an integrated value of 50% is referred to as a median diameter ($d_{50}$).

In the low resistance conductive layer 5, the conductive nanoparticles are, for example, silver nanoparticles, and the sintered metal layer is, for example, a sintered silver layer (a porous silver layer).

In the conductive device 1, each edge 33 of the electrically conductive portion 3 overlaps, in plan view in the thickness direction D1 of the substrate 2, the opening edge 231 which is one of the pair of opening edges 231 and 232 in the width direction D2 of the corresponding one of the grooves 23, the opening edge 231 being closer to the corresponding one of the edges 33 of the electrically conductive portion 3 than the opening edge 232 is. The electrically conductive portion 3 includes projection portions 32 inserted in the grooves 23. The projection portions 32 are in contact with inner surfaces of the grooves 23. Each projection portion 32 is preferably in contact with the entirety of a bottom surface and a pair of inner side surfaces of the inner surfaces of a corresponding one of the grooves 23. The edges 33 of the electrically conductive portion 3 are constituted by edges 53 of the low resistance conductive layer 5. The projection portions 32 of the electrically conductive portion 3 are constituted by projection portions 52 of the low resistance conductive layer 5 which are inserted in the grooves 23.

Moreover, in the conductive device 1, each edge 43 of the electrically conductive part 4 overlaps, in plan view in the thickness direction D1 of the substrate 2, the opening edge 241 which is one of the pair of opening edges 241 and 242 in the width direction of the corresponding one of the grooves 24, the opening edges 241 being closer to the corresponding one of the edges 43 of the electrically conductive part 4 than the second opening edge 242 is. The electrically conductive part 4 includes projection portions 34 inserted in the grooves 24. The projection portions 34 are in contact with inner surfaces of the grooves 24. Each projection portion 34 is preferably in contact with the entirety of a bottom surface and a pair of inner side surfaces of the inner surfaces of a corresponding one of the grooves 24.

Moreover, the electrically conductive portion 3 further includes second projection portions 35 other than the projection portions 32 (hereinafter referred to also as first projection portions 32) of the electrically conductive portion 3. The second projection portions 35 are inserted in the second grooves 25 which are included in the plurality of second grooves 25 of the substrate 2 and which are other than the third grooves 24. The second projection portions 35 are in contact with inner surfaces of the second grooves 25. Each second projection portion 35 is preferably in contact with the entirety of a bottom surface and a pair of inner side surfaces of the inner surfaces of a corresponding one of the second grooves 25.

(2.3) Protecting Sheet

The protecting sheet 7 is a sheet for protecting the electrically conductive portion 3. In this embodiment, the protecting sheet 7 preferably has a gas barrier property and humidity resistance. The protecting sheet 7 may have water repellency.

The protecting sheet 7 is stacked on the substrate 2 and covers the electrically conductive portion 3. In this embodiment, the protecting sheet 7 covers the substrate 2 and the electrically conductive portion 3 at the side of the first principal surface 21 of the substrate 2. The protecting sheet 7 has a principal surface 71 on an opposite side of the substrate 2. The protecting sheet 7 is, for example, flexible. The thickness of the protecting sheet 7 is, for example, greater than or equal to 30 μm and less than or equal to 200 μm. The protecting sheet 7 has a thickness of, for example, 50 μm. The protecting sheet 7 is, for example, a plastic film The plastic film is, but not limited to, a polyethylene terephthalate film and may be, for example, an ABS film, a polyethylene naphthalate film, a polyether sulfone film, a polycarbonate film, a polyester film, or the like.

The substrate 2 is laminated with the protecting sheet 7. The protecting sheet 7 has a plurality of projection portions 76 inserted in the plurality of recesses 26 on a one-to-one basis. Each of the plurality of projection portions 76 is in contact with inner surfaces of a corresponding recess 26 of the plurality of recesses 26. Each of the plurality of projection portions 76 is preferably in contact with the entirety of a bottom surface and a pair of inner side surfaces of the inner surfaces of the corresponding recess 26 of the plurality of recesses 26.

(3) Method for Producing Conductive Device

A method for producing the conductive device 1 will be described below with reference to FIGS. 4, 5A, 5B, and 6.

In the method for producing the conductive device 1, for example, the following first to fifth steps are sequentially performed.

As illustrated in FIG. 4, the substrate 2 having the plurality of grooves 20 is prepared in the first step. In this embodiment, the plurality of grooves 20 include the first grooves 23, the plurality of second grooves 25, and the plurality of recesses 26 but is only required to include at least the first the grooves 23. In the method for producing the conductive device according to a first embodiment, the first step is included in a substrate preparation step of preparing the substrate 2.

In the second step, the conductive paste 400 containing the electrically conductive particles 410 (see FIG. 3), the organic binder 420 (see FIG. 3), and a solvent is applied in a formation target area of the electrically conductive part 4 on the substrate 2 as illustrated in FIG. 5A. In the method for producing the conductive device 1 according to the first embodiment, the second step is included in an application step (a first application step) of applying the conductive paste 400 containing the electrically conductive particles 410, the organic binder 420, and the solvent in the formation target area of the electrically conductive part 4 on the substrate 2. As the conductive paste 400, for example, paste is used which is prepared by mixing the organic binder 420 and the organic solvent with powder containing the plurality of electrically conductive particles 410. In the second step, for example, the conductive paste 400 is applied by, for example, a dispenser system. The dispenser system includes a table for holding the substrate 2, a dispenser head 441 (see FIG. 5A), and a nozzle 442 (see FIG. 5A) held by the dispenser head 441 and configured to eject the conductive paste 400. FIG. 5A schematically shows how the conductive paste 400 is ejected from the nozzle 442 and is applied while the dispenser head 441 is moved along the formation target area of the electrically conductive part 4 on the substrate 2 in order to form the electrically conductive part 4 having a line shape.

In the example shown in FIG. 5A, changing the ejection speed of the dispenser head 441 enables the dropping amount (application quantity) of the conductive paste per unit time to be changed, changing the dropping amount and the moving speed of the dispenser head 441 enables the amount of the conductive paste 400 applied per unit area to be controlled, and the conductive paste 400 can have an application shape based on the shape of the electrically conductive part 4. In this embodiment, the dispenser system preferably includes: a movement mechanism constituted by a robot configured to move the dispenser head 441; a sensor part configured to measure a height from a table to a first principal surface 21 of the substrate 2 and a height from the table to the nozzle 442; and a controller configured to control the ejection speed of the conductive paste 400 from the movement mechanism and the nozzle 442. The controller may be implemented by, for example, installing an according program on a microcomputer. The controller moves the dispenser head 441 based on data in a prescribed pattern in plan view in a design configuration of the electrically conductive part 4 designed by, for example, Computer Aided Design (CAD).

Moreover, the application shape of the conductive paste 400 can be controlled by adjusting, for example, the viscosity, the thixotropy, and the like of the conductive paste 400. Moreover, the application shape of the conductive paste 400 can be controlled by adjusting, for example, the viscosity and the like of the conductive paste 400. The curvature of the surface 41 of the electrically conductive part 4 is adjustable by the viscosity, the surface tension, and the like of the conductive paste 400. The curvature can be increased by, for example, increasing the viscosity or increasing the surface tension of the conductive paste 400. The dispenser system may include a heater configured to heat the conductive paste 400 such that the viscosity of the conductive paste 400 before application is a desired viscosity.

In the third step, the conductive paste 400 is heated to form the electrically conductive part 4 (see FIG. 5B). In the method for producing the conductive device 1 according to the first embodiment, the third step is included in a thermally curing step of heating the conductive paste 400 to form the electrically conductive part 4.

In the fourth step, the conductive ink 500 (see FIG. 6) containing the conductive nanoparticles is applied to cover the surface 41 of the electrically conductive part 4. In the method for producing the conductive device 1 according to the first embodiment, the fourth step is included in a second application step of applying the conductive ink 500 serving as a basis of the low resistance conductive layer 5 to a formation target area of the low resistance conductive layer 5. The conductive ink 500 is ink containing the conductive nanoparticles (e.g., silver nanoparticles), a volatile binder, and a solvent. In the fourth step, the conductive ink 500 is applied by a dispenser system or the like. The dispenser system used in the fourth step has substantially the same configuration as the dispenser system used in the second step but is different in that a dispenser head 551 is provided in place of the dispenser head 441, and a nozzle 552 configured to eject the conductive ink 500 is provided in place of the nozzle 442 configured to eject the conductive paste 400. The dispenser system used in the fourth step includes a controller configured to move the dispenser head 551 based on data in a prescribed pattern in plan view in the design configuration of the low resistance conductive layer 5 designed by, for example, CAD. The viscosity of the conductive ink 500 is less than the viscosity of the conductive paste 400. Note that as the value of the viscosity, a value may be adopted which is measured by, for example, a circular cone flat plate-type rotatory viscometer under an ordinary temperature.

Figure 2:
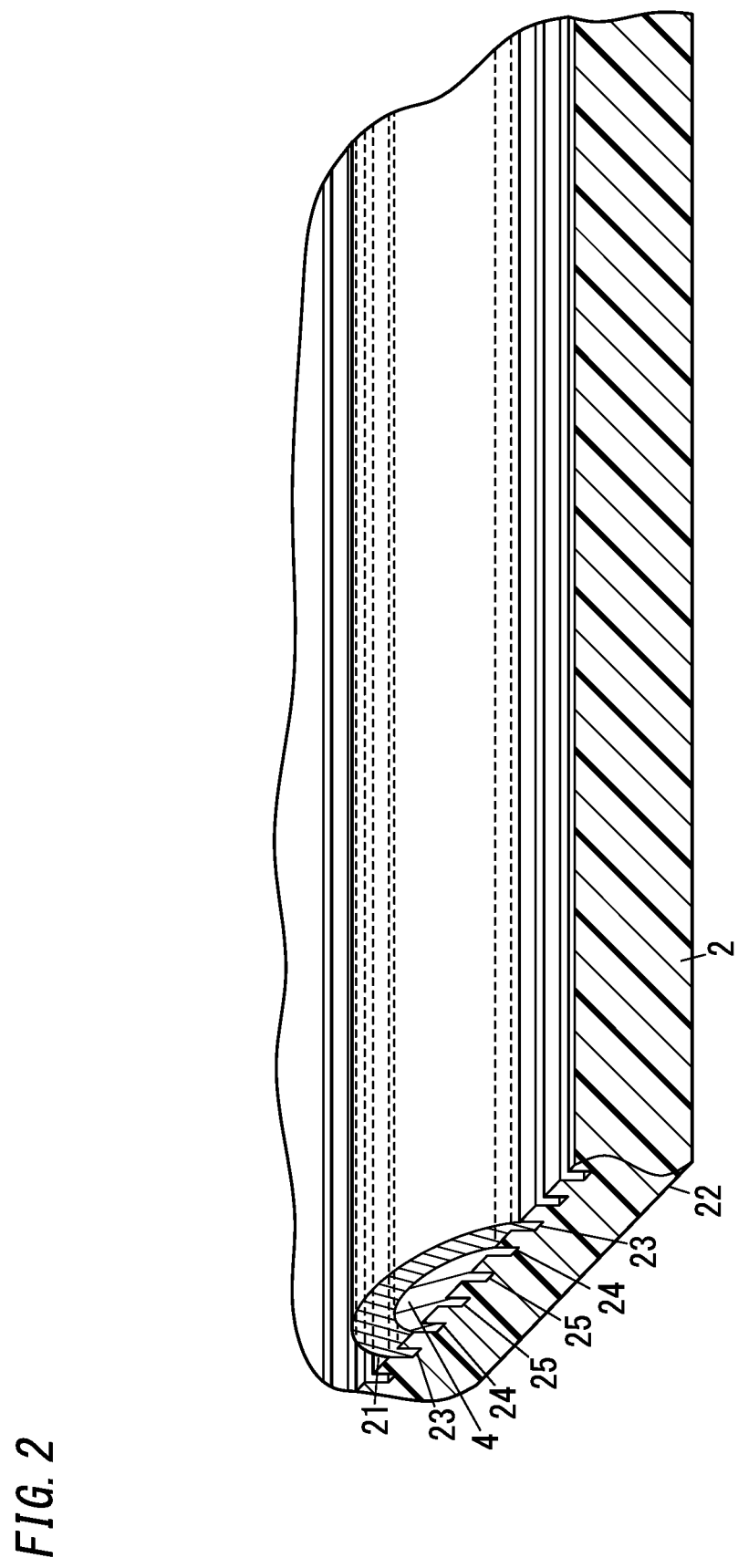
FIG. 2 is a partially cutaway perspective view illustrating the conductive device.

In the fifth step, the conductive ink 500 is dried and is then heated to form the low resistance conductive layer 5 (see FIG. 2). In the fifth step, metallic bonding of adjacent conductive nanoparticles is performed. In the method for producing the conductive device 1 according to the first embodiment, the fifth step is included in a thermal process step of forming the low resistance conductive layer 5 from the conductive ink 500.

(4) Application Example of Conductive Device

The conductive device 1 is a device including the electrically conductive portion 3 as a component having a conductive function.

Figure 7:
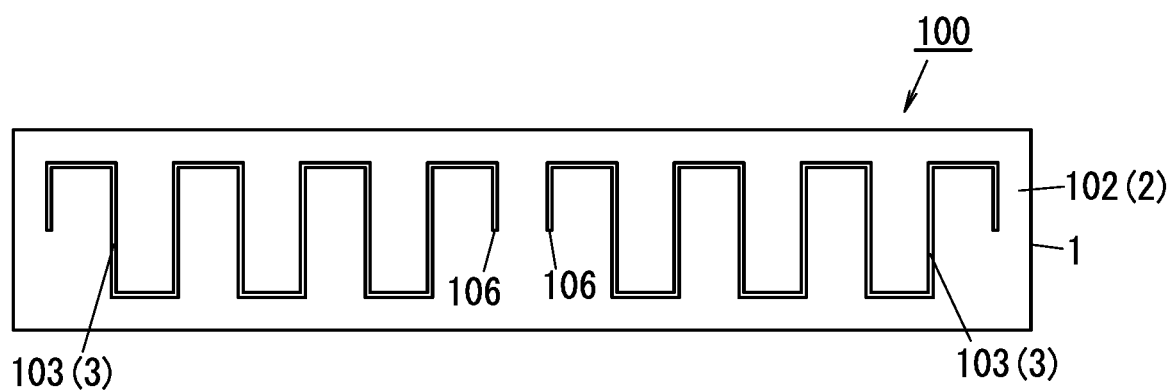
FIG. 7 is a plan view illustrating an antenna device including the conductive device.

As an application example of the conductive device 1, an antenna device 100 including the conductive device 1 as illustrated in FIG. 7 will be described below.

The antenna device 100 is a dipole antenna including a dielectric substrate 102 and two radiation conductors 103 aligned in one direction on the dielectric substrate 102. The two radiation conductors 103 are each on opposite sides of the power feeders 106 in the one direction. Each of the two radiation conductors 103 has a meander shape. The dielectric substrate 102 of the antenna device 100 is constituted by the substrate 2 of the conductive device 1. Each of the two radiation conductors 103 is constituted by the electrically conductive portion 3 of the conductive device 1. In FIG. 7, the protecting sheet 7 is omitted.

Figure 8:
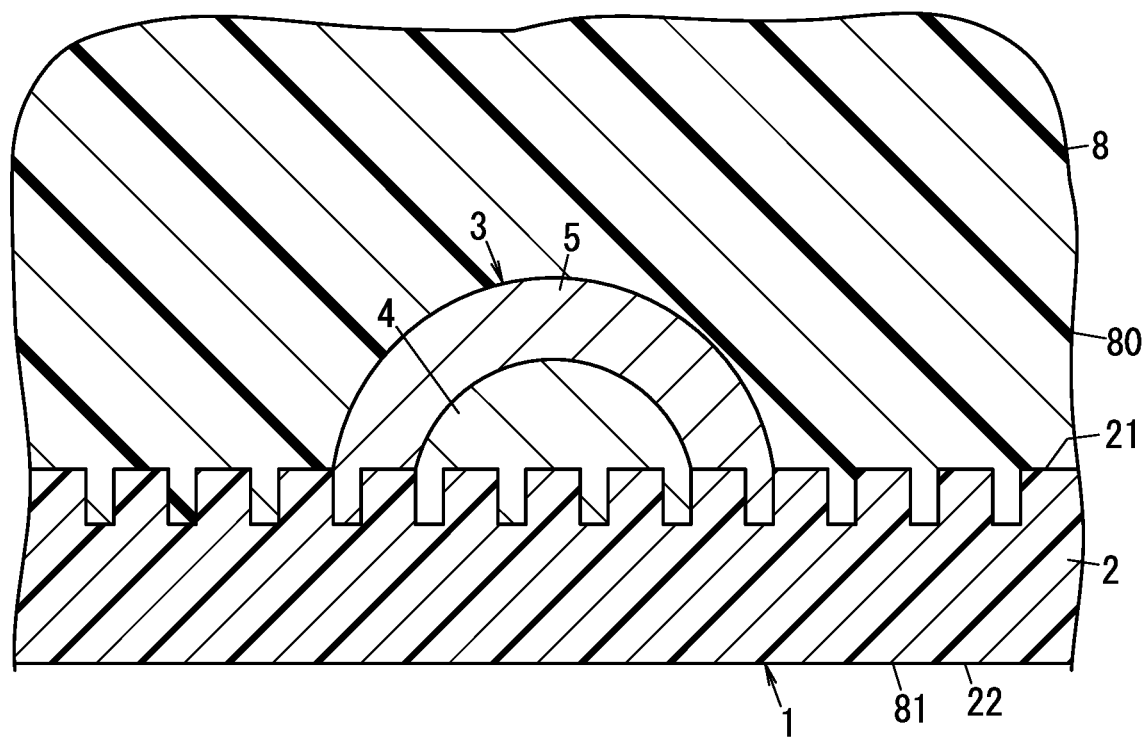
FIG. 8 is a sectional view illustrating a film insert molded product including the conductive device.

The conductive device 1 may include a film 81 in a film insert molded product 8 as illustrated in FIG. 8 without including the protecting sheet 7. The film insert molded product 8 includes the film 81 and a resin structural component 80. In the film insert molded product 8, the film 81 is provided in the resin structural component 80 by film insert molding.

Figure 9:
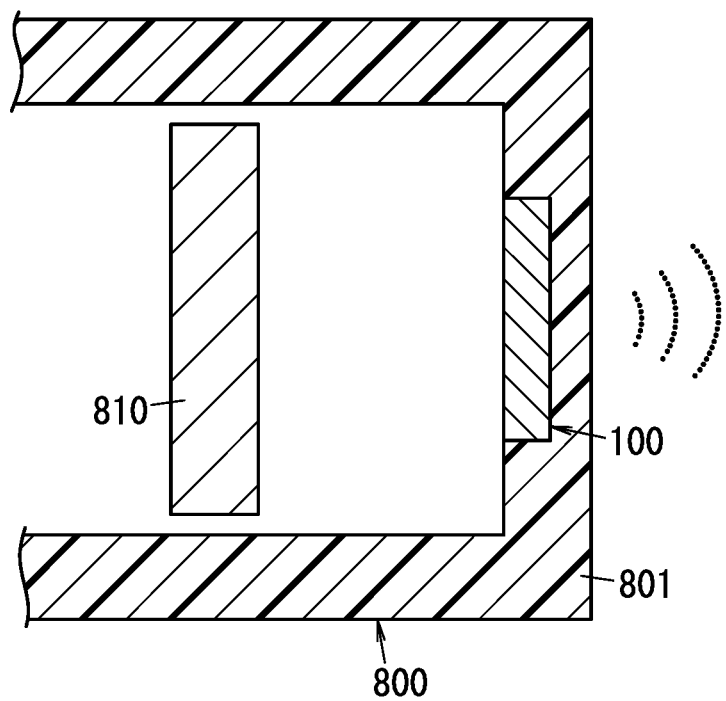
FIG. 9 is a sectional view illustrating a radio including the conductive device.

The antenna device 100 is used in, for example, a radio 800 as illustrated in FIG. 9. The radio 800 includes a housing 801. The housing 801 is a film insert molded product in which the antenna device 100 including the conductive device 1 is a film. In this embodiment, the conductive device 1 does not include the protecting sheet 7 and is film insert molded in the housing 801. Moreover, the radio 800 includes a wireless communication module 810 housed in the housing 801. The wireless communication module 810 performs wireless communication via the antenna device 100 with an external apparatus of the radio 800. The wireless communication module 810 includes, for example, a printed wiring board and a plurality of electronic components which are mounted on the printed wiring board and which constitute, together with the printed wiring board, a wireless communication circuit.

(5) Effect

In the conductive device 1 according to a first embodiment and the antenna device 100 including the conductive device 1, the resistance of the electrically conductive portion 3 can be reduced because the electrically conductive portion 3 includes the electrically conductive part 4 and the low resistance conductive layer 5.

Moreover, in the conductive device 1 according to the first embodiment and the antenna device 100 including the conductive device 1, each edge 33 of the electrically conductive portion 3 overlaps the opening edge 231 which is one of the pair of opening edges 231 and 232 in the width direction D2 of the corresponding one of the grooves 23, the opening edge 231 being closer to the corresponding one of the edges 33 of the electrically conductive portion 3 than the opening edge 232 is, and the electrically conductive portion 3 has the projection portions 32 inserted in the grooves 23, and thereby, the shape accuracy of the electrically conductive portion 3 can be improved. In this embodiment, the shape accuracy of the electrically conductive portion 3 includes the shape accuracy of the electrically conductive portion 3 with respect to a prescribed pattern in plan view in the design configuration of the electrically conductive portion 3. In the conductive device 1, the shape accuracy of the conductive portion 3 improves as the inward and outward distances of the conductive portion 3 from the edge of the predetermined pattern decrease.

Moreover, since the electrically conductive portion 3 has stretchability, the film insert molded product 8 including the conductive device 1 can suppress the electrically conductive portion 3 from being broken at the time of the film insert molding.

Moreover, in the method for producing the conductive device 1 according to the first embodiment, the resistance of the electrically conductive portion 3 can be reduced. Further, in the method for producing the conductive device 1 according to the first embodiment, the shape accuracy of the electrically conductive portion 3 can be improved. Furthermore, in the method for producing the conductive device 1 according to the first embodiment, the shape reproducibility of the electrically conductive portion 3 can be improved, and variations in the characteristics of the conductive device 1 can be reduced.

Figure 3:
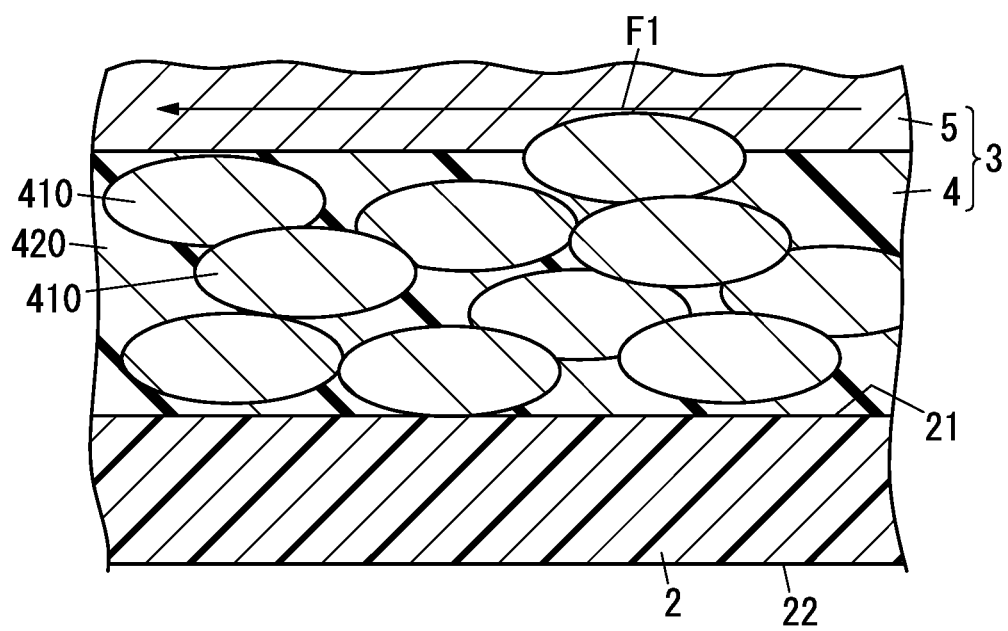
FIG. 3 is a sectional view orthogonal to a width direction of the electrically conductive portion of the conductive device.

Moreover, in the antenna device 100 including the conductive device 1 according to the first embodiment, antenna characteristics can be improved. In this embodiment, each radiation conductor 103 of the antenna device 100 is constituted by the electrically conductive portion 3 including the low resistance conductive layer 5, and therefore, the resistance can be more reduced, and transmission loss caused by a skin effect of the electrically conductive portion 3 can be more reduced, than in the case where the electrically conductive portion 3 includes only the electrically conductive part 4. In FIG. 3, the arrow F1 schematically indicates a transmission pathway of a high frequency signal when the high frequency signal is transmitted through the electrically conductive portion 3 of the conductive device 1. In a comparative example which has substantially the same configuration as the conductive device 1 but which has no low resistance conductive layer 5, the skin effect transmits, in the vicinity of the surface 41 of the electrically conductive part 4, a high frequency signal along surfaces of the plurality of electrically conductive particles 410 aligned in the length direction of the electrically conductive part 4. Thus, in the comparative example, the unevenness of the surface 41 of the electrically conductive part 4 increases the transmission loss, whereas in the conductive device 1 including the low resistance conductive layer 5, the skin effect transmits the high frequency signal along the low resistance conductive layer 5, thereby reducing the transmission loss.

Variation of First Embodiment

Figure 10:
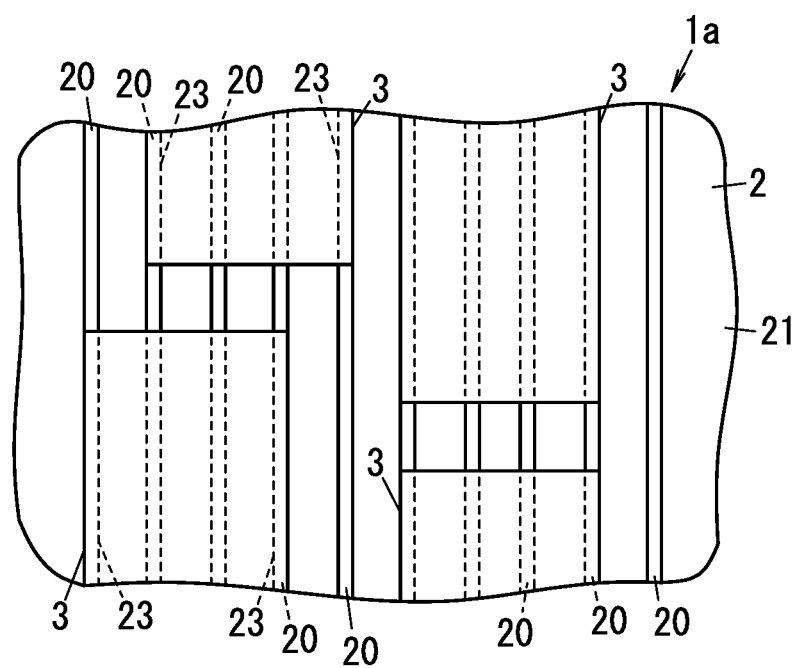
FIG. 10 is a plan view illustrating a conductive device according to a variation of the first embodiment.

A conductive device 1a according to a variation of the first embodiment will be described below with reference to FIG. 10.

The conductive device 1a according to the variation of the first embodiment is substantially the same as the conductive device 1 of the first embodiment but includes a plurality of electrically conductive portions 3. In the conductive device 1a according to the variation, components similar to those in the conductive device 1 of the first embodiment are denoted by the same reference signs as those in the first embodiment, and the description thereof is omitted.

The conductive device 1a according to the variation may be used as a wiring device in place of, for example, the printed wiring board. In the conductive device 1a according to the variation, for example, each of the plurality of electrically conductive portions 3 constitutes a wiring section.

In the conductive device 1a according to the variation, each of the plurality of electrically conductive portions 3 is provided to overlap at least four grooves 20 of a plurality of grooves 20 formed in a substrate 2 in plan view in a thickness direction D1 (see FIG. 1) of the substrate 2.

In the conductive device 1a according to the variation, the shape accuracy of each electrically conductive portion 3 can be improved in a similar manner to the conductive device 1 of the first embodiment. This can improve the accuracy in respective wiring widths of the plurality of wiring sections constituted by the plurality of electrically conductive portions 3.

Second Embodiment

Figure 11:
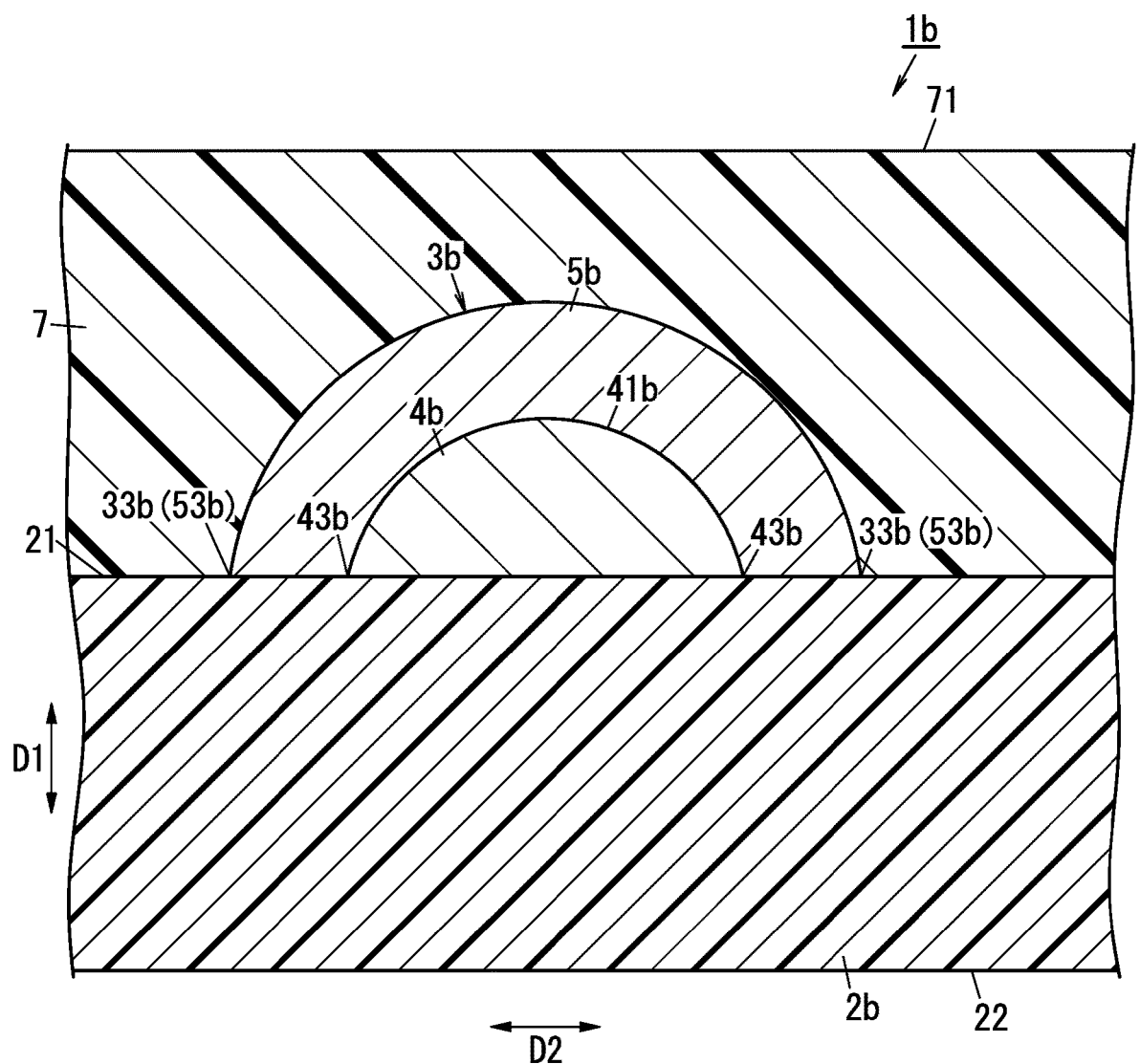
FIG. 11 is a sectional view orthogonal to a longitudinal direction of an electrically conductive portion of a conductive device according to a second embodiment.

A conductive device 1b according to a second embodiment will be described below with reference to FIG. 11.

The conductive device 1b according to the second embodiment is substantially the same as the conductive device 1 of the first embodiment but is different from the conductive device 1 of the first embodiment in that a substrate 2b is provided in place of the substrate 2 and that an electrically conductive portion 3b is provided in place of the electrically conductive portion 3. In the conductive device 1b according to the second embodiment, components similar to those in the conductive device 1 of the first embodiment are denoted by the same reference signs as those in the first embodiment, and the description thereof is omitted.

The substrate 2b of the conductive device 1b according to the second embodiment includes a first principal surface 21 and a second principal surface 22 in a similar manner to the substrate 2. The substrate 2b does not have the plurality of grooves 20 in the substrate 2 in the conductive device 1 of the first embodiment. That is, the substrate 2b has no grooves 20 formed therein.

The electrically conductive portion 3b includes an electrically conductive part 4b and a low resistance conductive layer 5b respectively in place of the electrically conductive part 4 and the low resistance conductive layer 5 of the electrically conductive portion 3. The low resistance conductive layer 5b is stacked on, for example, the entirety of a surface 41b of the electrically conductive part 4b. The surface 41b of the electrically conductive part 4b is a surface of the electrically conductive part 4b which is not in contact with the substrate 2b.

In the conductive device 1b, edges 33b of the electrically conductive portion 3b are constituted by edges 53b of the low resistance conductive layer 5b in plan view in a thickness direction D1 of the substrate 2b. Moreover, in the conductive device 1b, edges 43b of the electrically conductive part 4b are located on an inner side of the edges 53b of the low resistance conductive layer 5b in plan view in a thickness direction D1 of the substrate 2b.

A method for producing the conductive device 1b according to the second embodiment is substantially the same as the method for producing the conductive device 1 of the first embodiment but is different from the method for producing the conductive device 1 of the first embodiment in that the substrate 2b is prepared in place of the substrate 2 in the substrate preparation step.

In the conductive device 1b according to the second embodiment, the resistance of the electrically conductive portion 3b can be reduced in a similar manner to the conductive device 1 of the first embodiment.

First Variation of Second Embodiment

Figure 12:
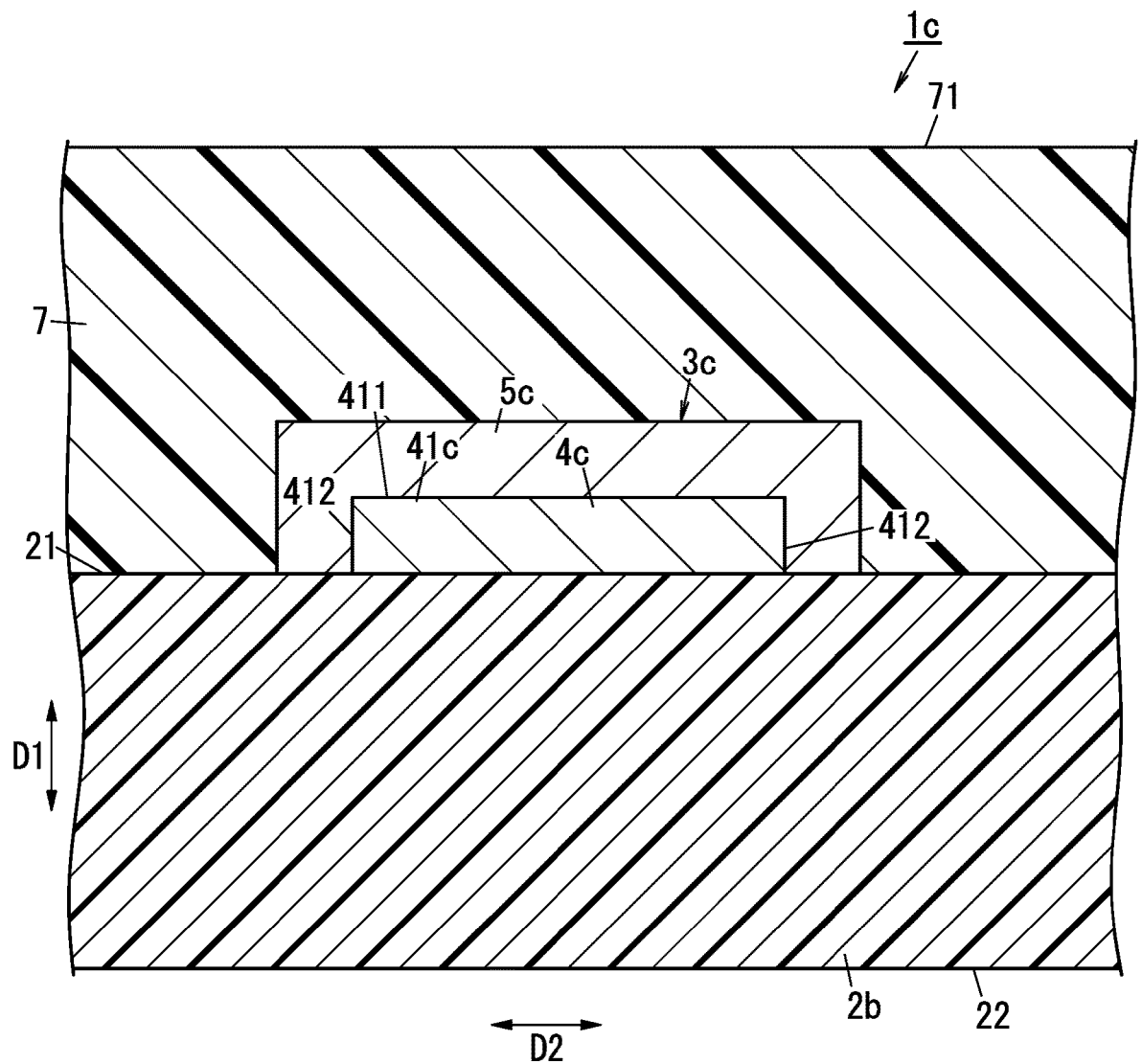
FIG. 12 is a sectional view orthogonal to a longitudinal direction of an electrically conductive portion of a conductive device according to a first variation of the second embodiment.

A conductive device 1c according to a first variation of the second embodiment will be described below with reference to FIG. 12.

The conductive device 1c according to the first variation of the second embodiment is substantially the same as the conductive device 1b of the second embodiment but is different from the conductive device 1b of the second embodiment in that an electrically conductive portion 3c is further provided in place of the electrically conductive portion 3b. In the conductive device 1c according to the first variation, components similar to those in the conductive device 1b of the second embodiment are denoted by the same reference signs as those in the second embodiment, and the description thereof is omitted.

The electrically conductive portion 3c includes an electrically conductive part 4c and a low resistance conductive layer 5c respectively in place of the electrically conductive part 4b and the low resistance conductive layer 5b of the electrically conductive portion 3b. In the electrically conductive portion 3c, shapes of the electrically conductive part 4c and the low resistance conductive layer 5c are respectively different from the shapes of the electrically conductive part 4b and the low resistance conductive layer 5b of the electrically conductive portion 3b.

The electrically conductive part 4c has a rectangular cross section orthogonal to a length direction of the electrically conductive part 4c. The thickness of the electrically conductive part 4c is substantially uniform. The electrically conductive part 4c has a surface 41c which is a surface of the electrically conductive part 4c and which is not in contact with the substrate 2b. More specifically, the surface 41c of the electrically conductive part 4c has a principal surface 411 and a pair of side surfaces 412 and 412 in a width direction of the electrically conductive part 4c. The principal surface 411 intersects (is substantially orthogonal to) a thickness direction D1 of the substrate 2b on an opposite side from the substrate 2 in the thickness direction D1.

The low resistance conductive layer 5c covers the principal surface 411 and the pair of side surfaces 412 and 412 of the surface 41c of the electrically conductive part 4c.

A method for producing the conductive device 1c according to the first variation is substantially the same as the method for producing the conductive device 1b of the second embodiment but is different from the method for producing the conductive device 1b of the second embodiment in that a screen printing method is used when the conductive paste 400 is applied and that a screen printing method is used when the conductive ink 500 is applied.

In the conductive device 1c according to the first variation and the method for producing the conductive device 1c, the resistance of the electrically conductive portion 3c can be reduced in a similar manner to the conductive device 1b of the second embodiment.

Second Variation of Second Embodiment

Figure 13:
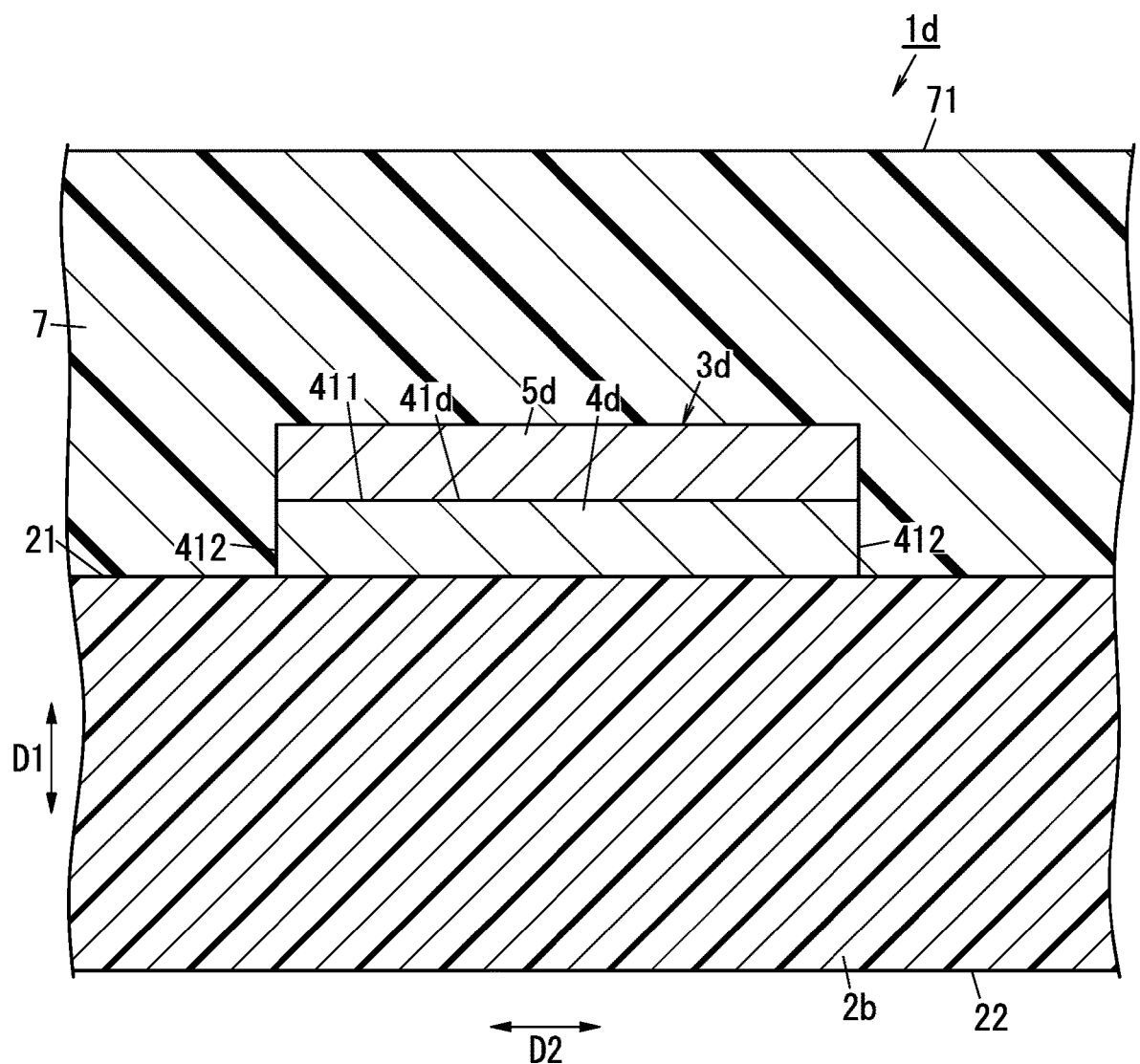
FIG. 13 is a sectional view orthogonal to a longitudinal direction of an electrically conductive portion of a conductive device according to a second variation of the second embodiment.

A conductive device 1d according to a second variation of the second embodiment will be described below with reference to FIG. 13.

The conductive device 1d according to the second variation is substantially the same as the conductive device 1c of the first variation of the second embodiment but is different from the conductive device 1c of the first variation of the second embodiment in that an electrically conductive portion 3d is further provided in place of the electrically conductive portion 3c. In the conductive device 1d according to the second variation, components similar to those in the conductive device 1c of the first variation are denoted by the same reference signs as those in the first variation, and the description thereof is omitted.

The electrically conductive portion 3d includes an electrically conductive part 4d and a low resistance conductive layer 5d respectively in place of the electrically conductive part 4c and the low resistance conductive layer 5c of the electrically conductive portion 3c. In the electrically conductive portion 3d, the shape of the low resistance conductive layer 5d is different from the shape of the low resistance conductive layer 5c of the electrically conductive portion 3c.

The electrically conductive part 4d has a rectangular cross section orthogonal to a length direction of the electrically conductive part 4d. The thickness of the electrically conductive part 4d is substantially uniform. The electrically conductive part 4d has a surface 41d which is a surface of the electrically conductive part 4d and which is not in contact with the substrate 2b. More specifically, the surface 41d of the electrically conductive part 4d has a principal surface 411 and a pair of side surfaces 412 and 412 in a width direction of the electrically conductive part 4d. The principal surface 411 intersects (is substantially orthogonal to) a thickness direction D1 of the substrate 2b on an opposite side from the substrate 2 in the thickness direction D1.

The low resistance conductive layer 5d covers only the principal surface 411 of the principal surface 411 and the pair of side surfaces 412 and 412 of the surface 41d of the electrically conductive part 4d. That is, the low resistance conductive layer 5d covers part of the surface 41d of the electrically conductive part 4d. The thickness of the low resistance conductive layer 5d is substantially uniform.

A method for producing the conductive device 1d of the second variation is substantially the same as the method for producing the conductive device 1c of the first variation but is different from the method for producing the conductive device 1c of the first variation in that a mask different from that in the method for producing the conductive device 1c of the first variation is used when conductive ink 500 is applied.

In the conductive device 1d according to the second variation and the method for producing the conductive device 1d, the resistance of the electrically conductive portion 3d can be reduced in a similar manner to the conductive device 1b of the second embodiment.

Third Embodiment

Figure 14:
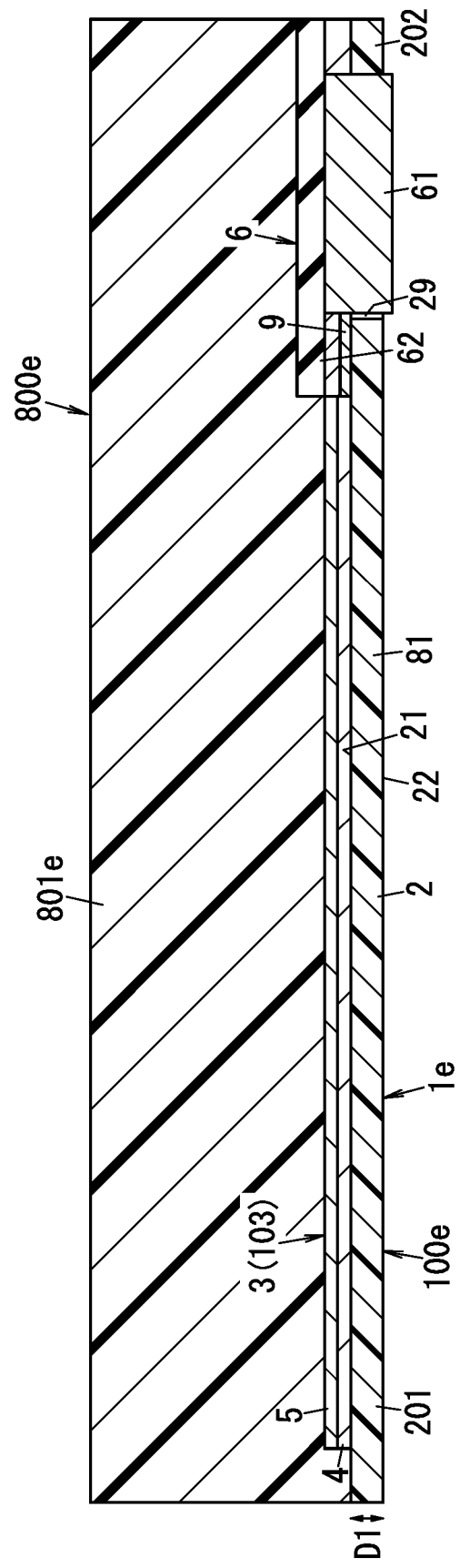
FIG. 14 is a sectional view illustrating a radio including a conductive device according to a third embodiment.

A radio 800e including a conductive device 1e according to a third embodiment will be described below with reference to FIG. 14.

The radio 800e according to the third embodiment includes the conductive device 1e as an antenna device 100e. In the radio 800e according to the third embodiment, a housing 801e and the conductive device 1e are integrated with each other. In the conductive device 1e according to the third embodiment, components similar to those in the conductive device 1 of the first embodiment are denoted by the same reference signs as those in the first embodiment, and the description thereof is omitted.

Moreover, the radio 800e according to the third embodiment further includes a connection terminal 6. The connection terminal 6 is electrically connected to the conductive device 1e. In this embodiment, the connection terminal 6 is electrically connected to the radiation conductor 103 constituted by the electrically conductive portion 3 of the antenna device 100e via a connector 9. The radio 800e includes the connector 9 disposed between the connection terminal 6 and the radiation conductor 103 and electrically connecting the connection terminal 6 to the radiation conductor 103. The connector 9 is conductive. The connector 9 is made of, for example, conductive paste. The conductive paste is, for example, silver paste but is not limited to this example. The conductive past may be, for example, copper paste.

The radio 800e can electrically connect the conductive device 1e to a component (e.g., a connector mounted on a printed wiring board) outside the conductive device 1e via the connection terminal 6.

The connection terminal 6 includes a through part 61 and a base part 62. The through part 61 penetrates a substrate 2 in a thickness direction D1 of the substrate 2. In this embodiment, a protrusion length of the through part 61 from the base part 62 is greater than the thickness of the substrate 2. Part of the through part 61 is located in a through hole 29 extending in the thickness direction D1 through the substrate 2. The base part 62 is between the substrate 2 and the housing 801e. The connection terminal 6 includes, for example, a coaxial connector (a high frequency coaxial connector). In this case, the through part 61 of the connection terminal 6 includes a center contact and an external contact of the coaxial connector. The connection terminal 6 is provided at a second end 202 of a first end 201 and the second end 202 in a longitudinal direction of the substrate 2.

The housing 801e is a film insert molded product in which the conductive device 1e serves as a film 81. In this embodiment, the conductive device 1e does not include a protecting sheet 7 and film insert molded in the housing 801e. The housing 801e is a resin structural component. The shape of the housing 801e is not particularly limited and does not have to be a box shape. The material for the housing 801e is, but not limited to, polycarbonate and may be, for example, an ABS resin or polystyrene.

Moreover, the radio 800e includes a wireless communication module. The wireless communication module is electrically connected to the antenna device 100e via, for example, the connector described above. The wireless communication module performs wireless communication via the antenna device 100e with an external apparatus of the radio 800e. The wireless communication module includes, for example, the printed wiring board and a plurality of electronic components mounted on the printed wiring board and constituting, together with the printed wiring board, a wireless communication circuit.

Figure 15:
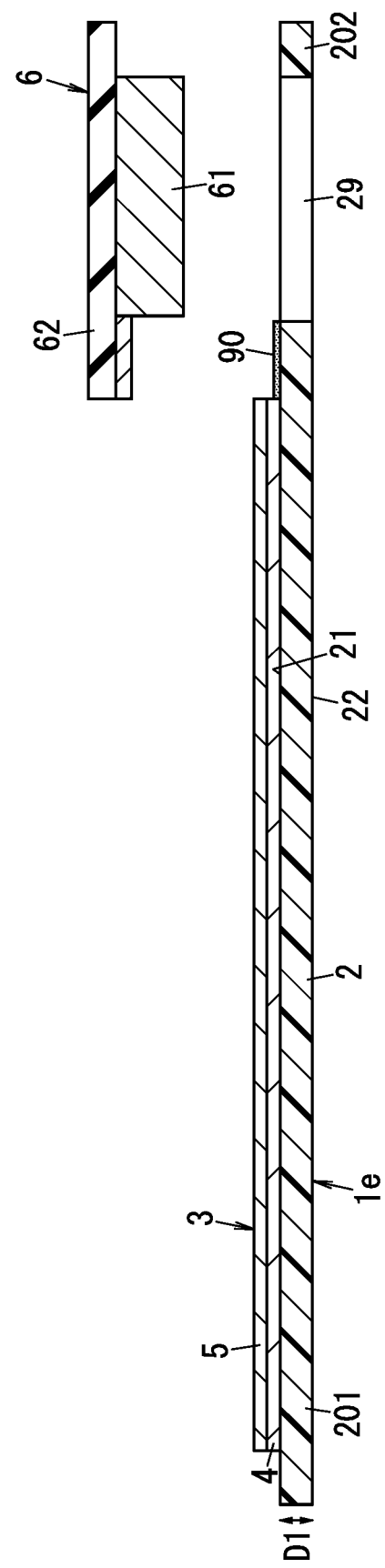
FIG. 15 is a view illustrating a method for producing the radio.
Figure 16:
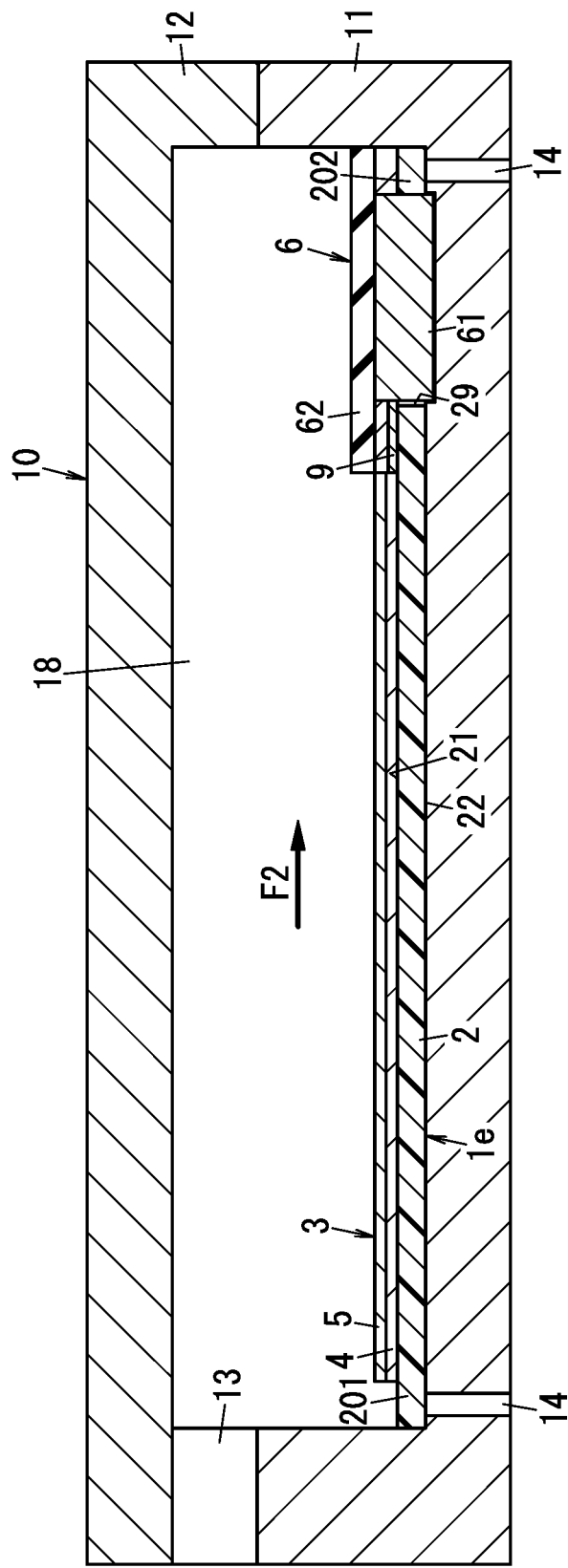
FIG. 16 is a view illustrating the method for producing the radio.

With reference to FIGS. 15 and 16, an example of a method for producing the radio 800e according to the third embodiment will be described below.

In the method for producing the radio 800e of the third embodiment, a first step, a second step, a third step, and a fourth step are sequentially performed.

In the first step, a conductive paste 90 (see FIG. 15) for electrically connecting the conductive device 1e to the connection terminal 6 is applied to the conductive device 1e, and the connection terminal 6 is then inserted into the through hole 29 formed in the substrate 2. Subsequently, the conductive paste 90 is hardened, thereby forming the connector 9 electrically connecting the conductive device 1e to the connection terminal 6.

In the second step, a structural component including the conductive device 1e and the connection terminal 6 is set in a mold 10 as illustrated in FIG. 16. Thus, a cavity 18 for forming the housing 801e is formed in the mold 10. The mold 10 has a plurality of suction holes 14 through which the conductive device 1e is sucked at the side of a second principal surface 22 of the substrate 2. Moreover, the mold 10 includes a gate 13 for resin injection. The gate 13 is located on an opposite side of the first end 201 of the substrate 2 from the second end 202, for example, viewed in a thickness direction of the mold 10 along the thickness direction D1 of the substrate 2. The mold 10 includes a lower mold (a first mold) 11 and an upper mold (a second mold) 12. The material for the mold 10 includes, for example, metal or an alloy.

In the third step, a melted molding resin material is injected into the cavity 18 through the gate 13 of the mold 10. Then, the molding resin material is hardened to form the housing 801e. The molding resin material is, but not limited to, polycarbonate and may be, for example, an ABS resin or polystyrene. In FIG. 16, the arrow F2 schematically indicates a dominant direction of directions in which the molding resin material injected into the mold through the gate 13 flows. The flow directions of the molding resin material includes other directions in addition to the direction indicated by the arrow F2.

In the fourth step, the housing 801e is released from the mold 10.

In the method for producing the radio 800e, a structural component corresponding to a plurality of housings 801e may be molded by using one mold 10, and the structural component may than be cut into individual film insert molded products.

In the radio 800e according to the third embodiment, the housing 801e and the conductive device 1e are integrated with each other. This can save the space in the radio 800e according to the third embodiment.

In this embodiment, the radiation conductor 103 constituted by the electrically conductive portion 3 of the antenna device 100e is covered with the housing 801e in the radio 800e according to the third embodiment. Thus, the radio 800e can protect the radiation conductor 103 by the housing 801e and can improve the durability of the antenna device 100e.

Moreover, the radio 800e according to the third embodiment further includes a connection terminal 6. The connection terminal 6 is electrically connected to the conductive device 1e. In the radio 800e, the conductive device 1e can be electrically connected to a component outside the conductive device 1e via the connection terminal 6. Thus, in the radio 800e according to the third embodiment, the conductive device 1e can be easily electrically connected to the component outside the conductive device 1e.

Moreover, in the radio 800e, the connection terminal 6 includes: the through part 61 extending through the substrate 2 in the thickness direction D1 of the substrate 2; and the base part 62 between the substrate 2 and the housing 801e. Thus, in the radio 800e, the connection terminal 6 can be suppressed from being positionally displaced.

First Variation of Third Embodiment

Figure 17:
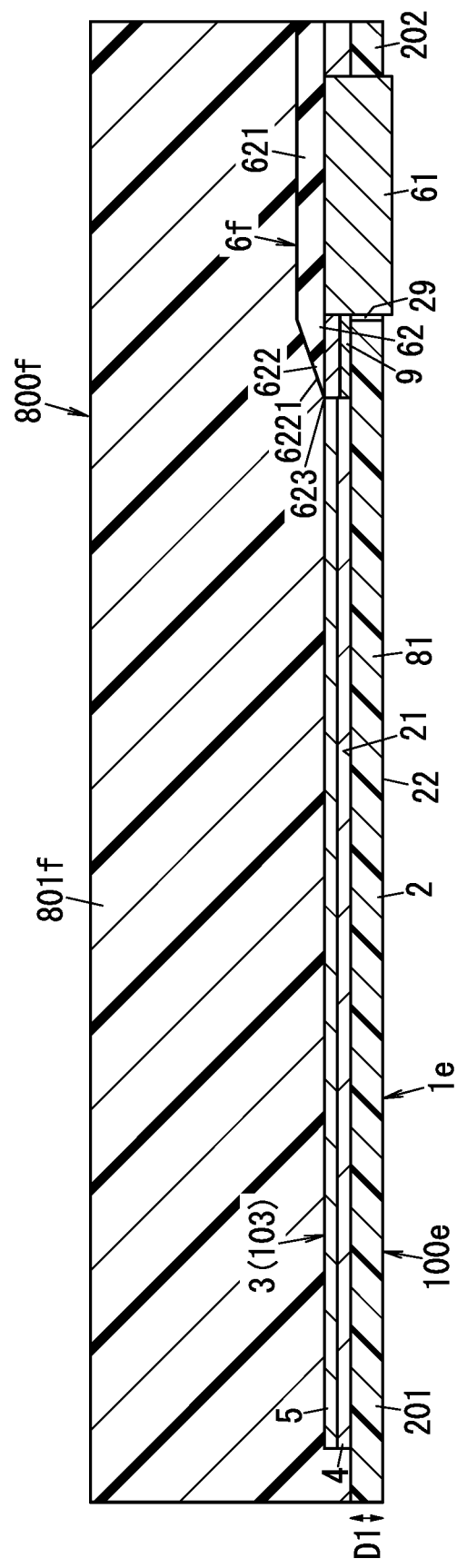
FIG. 17 is a sectional view of a radio according to a first variation of the third embodiment.

A radio 800f according to a first variation of the third embodiment will be described below with reference to FIG. 17.

The radio 800f according to the first variation of the third embodiment is substantially the same as the radio 800e of the third embodiment but is different from the radio 800e of the third embodiment in that a connection terminal 6f and a housing 801f are respectively provided in place of the connection terminal 6 and the housing 801e. In the radio 800f according to the first variation, components similar to those in the radio 800e of the third embodiment are denoted by the same reference signs as those in the third embodiment, and the description thereof is omitted.

The connection terminal 6f includes a through part 61 and a base part 62 in a similar manner to the connection terminal 6. The base part 62 is between the substrate 2 and the housing 801f. The connection terminal 6f includes, for example, a coaxial connector. The connection terminal 6f is different from the connection terminal 6 in that at least part of an outer peripheral part 622 of the base part 62 is thinner than a center part 621 of the base part 62. In this variation, part of the outer peripheral part 622 of the base part 62 of the connection terminal 6f gradually becomes thinner as the outer peripheral part is farther apart from the center part 621 of the base part 62. In this variation, outer peripheral part 622 of the base part 62 of the connection terminal 6f has a tilted surface 6221.

The housing 801f is a film insert molded product in which the conductive device 1e serves as a film 81 in a similar manner to the housing 801e. The housing 801f is a resin structural component. The material for the housing 801f is, but not limited to, polycarbonate and may be, for example, an ABS resin or polystyrene.

Moreover, the radio 800f includes a wireless communication module in a similar manner to the radio 800e of the third embodiment.

In the radio 800f according to the first variation of the third embodiment, the connection terminal 6f can be suppressed from positionally displaced due to the pressure of the molding resin material, for example, during manufacturing. In the radio 800f according to the first variation of the third embodiment, the connection terminal 6f can be suppressed from positionally displaced due to the pressure of the molding resin material when a molding resin material flows as indicate by the arrow F2 shown in FIG. 16, for example, during manufacturing. In this variation, the distance of the tilted surface 6221 from first principal surface 21 of the substrate 2 preferably increases as the tilted surface 6221 is farther away from an outer edge 623 of the base part 62 in the direction from which the molding resin material flows.

In the connection terminal 6f, the entirety of the outer peripheral part 622 of the base part 62 may gradually become thinner as the connection terminal is farther apart from the center part 621 of the base part 62. Moreover, the connection terminal 6f may have a step between a surface of the center part 621 of the base part 62 and a surface of the outer peripheral part 622, and at least part of the outer peripheral part 622 may be thinner than the center part 621.

Second Variation of Third Embodiment

A radio 800g according to a second variation of the third embodiment will be described below with reference to FIGS. 18A and 18B.

The radio 800g according to the second variation of the third embodiment is substantially the same as the radio 800e of the third embodiment but is different from the radio 800e of the third embodiment in that a connection terminal 6g and a housing 801g are respectively provided in place of the connection terminal 6 and the housing 801e. In the radio 800g according to the second variation of the third embodiment, components similar to those in the radio 800e of the third embodiment are denoted by the same reference signs as those in the third embodiment, and the description thereof is omitted.

The connection terminal 6g includes a through part 61 and a base part 62 in a similar manner to the connection terminal 6. The base part 62 is between the substrate 2 and the housing 801g. The connection terminal 6g includes, for example, a coaxial connector. The base part 62 has a surface in which a groove 624 is provided and which is located opposite from the substrate 2 in a thickness direction D1 of the substrate 2. As illustrated in FIG. 18B, the base part 62 has a plurality of grooves 624. In the connection terminal 6g, the plurality of grooves 624 are aligned, for example, at regular intervals, but this should not be construed as limiting. Alternatively, the plurality of grooves 624 may be aligned, for example, at irregular intervals. Note that each of the plurality of grooves 624 has a straight-line shape. Moreover, each of the plurality of grooves 624 is a U-shaped groove in a cross-sectional view orthogonal to a length direction of the groove 624.

The housing 801g is a film insert molded product in which the conductive device 1e serves as a film 81 in a similar manner to the housing 801e. The housing 801g is a resin structural component. The material for the housing 801g is, but not limited to, polycarbonate and may be, for example, an ABS resin or polystyrene.

Moreover, the radio 800g includes a wireless communication module in a similar manner to the radio 800e of the third embodiment.

In the radio 800g according to the second variation of the third embodiment, the connection terminal 6g can be suppressed from positionally displaced due to the pressure of the molding resin material, for example, during manufacturing. In the radio 800g according to the second variation of the third embodiment, the connection terminal 6g can be suppressed from positionally displaced due to the pressure of the molding resin material when a molding resin material flows as indicate by the arrow F2 shown in FIG. 16, for example, during manufacturing. Each of the plurality of grooves 624 preferably has, in its width direction, an opening width H6 of, for example, greater than or equal to 10 μm so that the molding resin material easily flows within the groove 624. Moreover, the opening width H6 is preferably, for example, less than or equal to 1 mm. The plurality of grooves 624 are formed through the entire length of the base part 62. Here, the plurality of grooves 624 are preferably formed over the entire length of the base part 62, that is, from a first end 6231 of an outer edge 623 of the base part 62 to a second end 6232 opposite from the first end 6231, the first end 6231 being an end from which the molding resin material flows.

Third Variation of Third Embodiment

Figure 19:
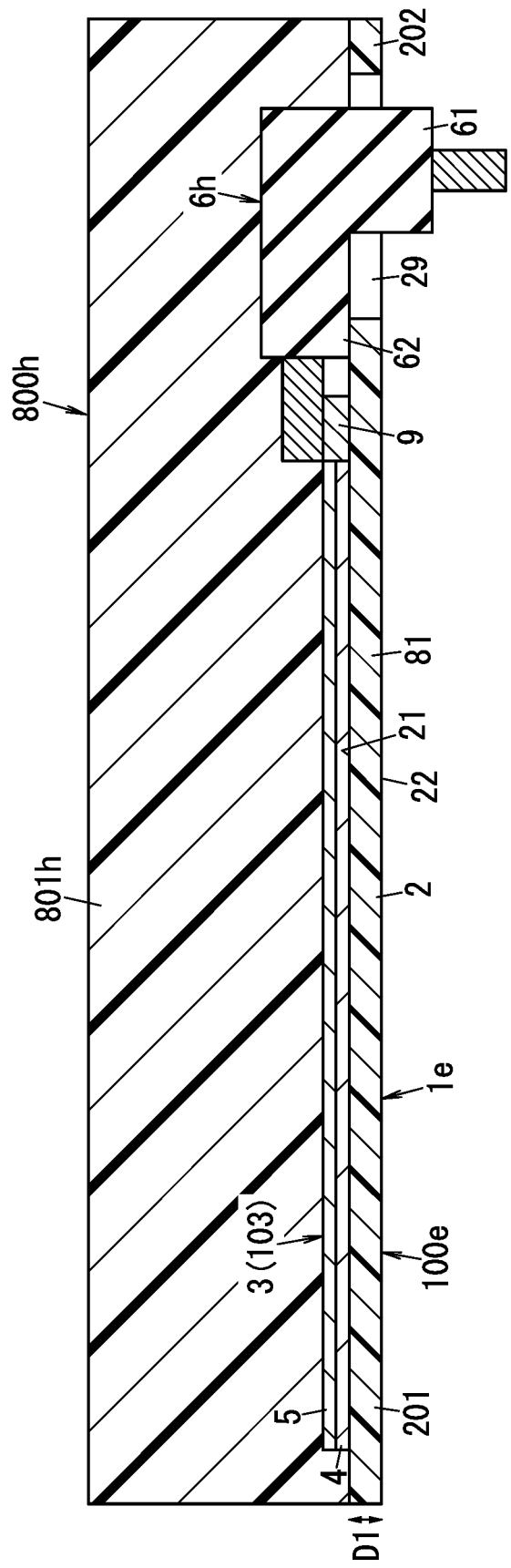
FIG. 19 is a sectional view illustrating a radio according to a third variation of the third embodiment.

A radio 800h according to a third variation of the third embodiment will be described below with reference to FIG. 19.

The radio 800h according to the third variation of the third embodiment is substantially the same as the radio 800e of the third embodiment but is different from the radio 800e of the third embodiment in that a connection terminal 6h and a housing 801h are respectively provided in place of the connection terminal 6 and the housing 801e. In the radio 800h according to the third variation of the third embodiment, components similar to those in the radio 800e of the third embodiment are denoted by the same reference signs as those in the third embodiment, and the description thereof is omitted.

The connection terminal 6h includes a through part 61 and a base part 62 in a similar manner to the connection terminal 6. The through part 61 extends through a through hole 29 formed in a substrate 2. The base part 62 is between the substrate 2 and the housing 801h. The connection terminal 6 includes the coaxial connector, whereas the connection terminal 6h includes, for example, a pin connector. The connection terminal 6h is electrically connected to the radiation conductor 103 constituted by the electrically conductive portion 3 of the antenna device 100e via a connector 9. The connection terminal 6h is electrically connected to the conductive device 1e. In the radio 800h, the conductive device 1e can be electrically connected to a component outside the conductive device 1e via the connection terminal 6h.

The housing 801h is a film insert molded product in which the conductive device 1e serves as a film 81 in a similar manner to the housing 801e. The housing 801h is a resin structural component. The material for the housing 801h is, but not limited to, polycarbonate and may be, for example, an ABS resin or polystyrene.

Moreover, the radio 800h includes a wireless communication module in a similar manner to the radio 800e of the third embodiment.

In the radio 800h according to the third variation of the third embodiment, the connection terminal 6h includes: the through part 61 extending through the substrate 2 in the thickness direction D1 of the substrate 2; and the base part 62 between the substrate 2 and the housing 801e in a similar manner to the radio 800e of the third embodiment. Thus, in the radio 800h according to the third variation of the third embodiment, the connection terminal 6h can be suppressed from being positionally displaced.

Fourth Variation of Third Embodiment

Figure 20:
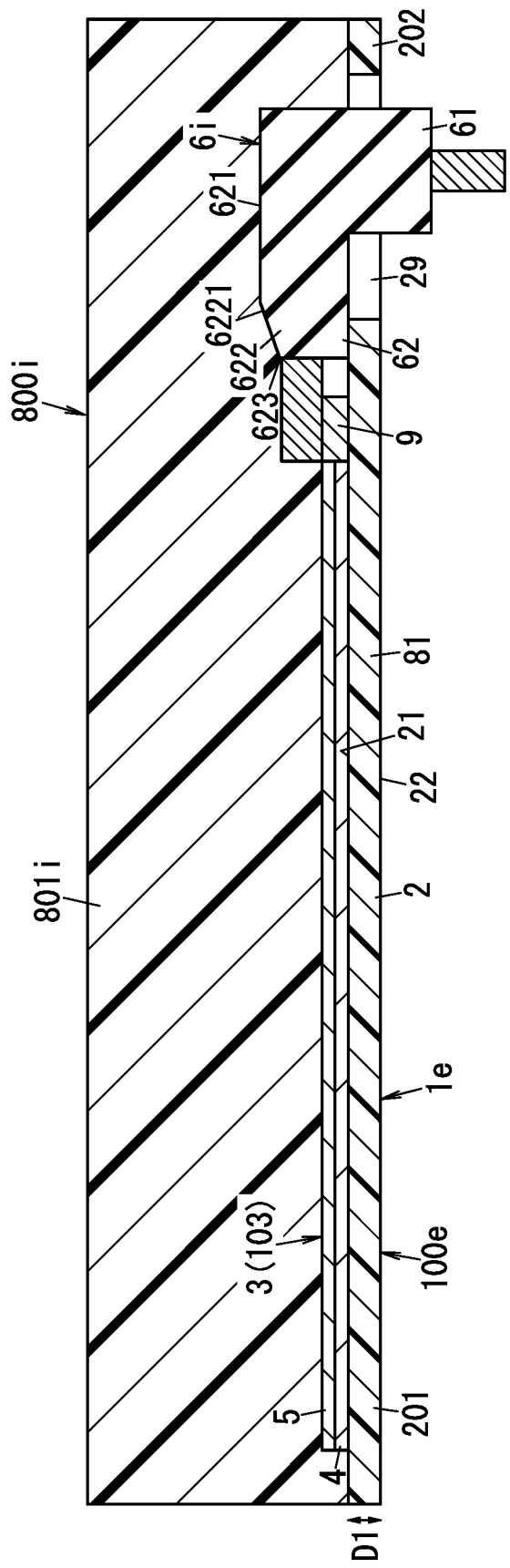
FIG. 20 is a sectional view illustrating a radio according to a fourth variation of the third embodiment.

A radio 800i according to a fourth variation of the third embodiment will be described below with reference to FIG. 20.

The radio 800i according to the fourth variation of the third embodiment is substantially the same as the radio 800e of the third embodiment but is different from the radio 800e of the third embodiment in that a connection terminal 6i and a housing 801i are respectively provided in place of the connection terminal 6 and the housing 801e. In the radio 800i according to the fourth variation of the third embodiment, components similar to those in the radio 800e of the third embodiment are denoted by the same reference signs as those in the third embodiment, and the description thereof is omitted.

The connection terminal 6i includes a through part 61 and a base part 62 in a similar manner to the connection terminal 6. The through part 61 extends through a through hole 29 formed in a substrate 2. The base part 62 is between the substrate 2 and the housing 801i. The connection terminal 6 includes the coaxial connector, whereas the connection terminal 6i includes, for example, a pin connector. The connection terminal 6i is electrically connected to the radiation conductor 103 constituted by the electrically conductive portion 3 of the antenna device 100e via a connector 9.

The connection terminal 6i is different from the connection terminal 6 in that at least part of an outer peripheral part 622 of the base part 62 is thinner than a center part 621 of the base part 62. In this variation, part of the outer peripheral part 622 of the base part 62 of the connection terminal 6i gradually becomes thinner as the outer peripheral part is farther apart from the center part 621 of the base part 62. In this variation, outer peripheral part 622 of the base part 62 of the connection terminal 6i has a tilted surface 6221.

The housing 801i is a film insert molded product in which the conductive device 1e serves as a film 81 in a similar manner to the housing 801e. The housing 801i is a resin structural component. The material for the housing 801i is, but not limited to, polycarbonate and may be, for example, an ABS resin or polystyrene.

Moreover, the radio 800i includes a wireless communication module in a similar manner to the radio 800e of the third embodiment.

In the radio 800i according to the fourth variation of the third embodiment, the connection terminal 6i can be suppressed from positionally displaced due to the pressure of the molding resin material, for example, during manufacturing. In the radio 800i according to the fourth variation of the third embodiment, the connection terminal 6i can be suppressed from positionally displaced due to the pressure of the molding resin material when a molding resin material flows as indicate by the arrow F2 shown in FIG. 16, for example, during manufacturing. In this variation, the distance of the tilted surface 6221 from first principal surface 21 of the substrate 2 preferably increases as the tilted surface 6221 is farther away from an outer edge 623 of the base part 62 in the direction from which the molding resin material flows.

In the connection terminal 6i, the entirety of the outer peripheral part 622 of the base part 62 may gradually become thinner as the connection terminal is farther apart from the center part 621 of the base part 62. Moreover, the connection terminal 6i may have a step between a surface of the center part 621 of the base part 62 and a surface of the outer peripheral part 622, and at least part of the outer peripheral part 622 may be thinner than the center part 621.

Fifth Variation of Third Embodiment

Figure 21A:
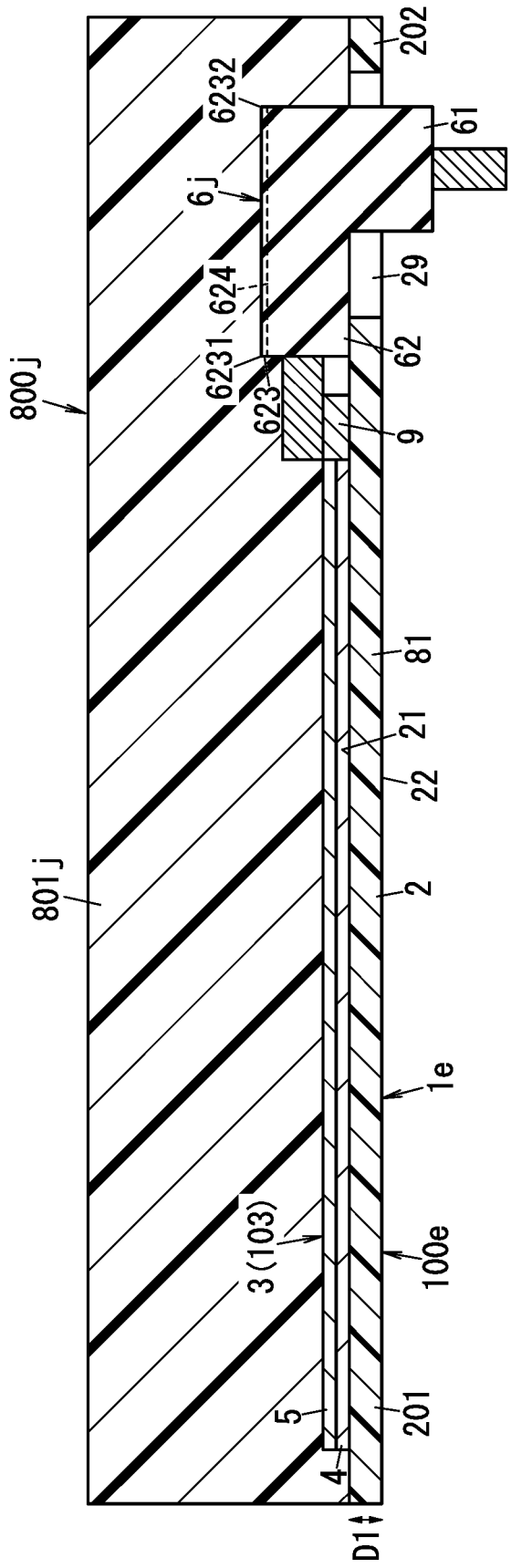
FIG. 21A is a sectional view illustrating a radio according to a fifth variation of the third embodiment.
Figure 21B:
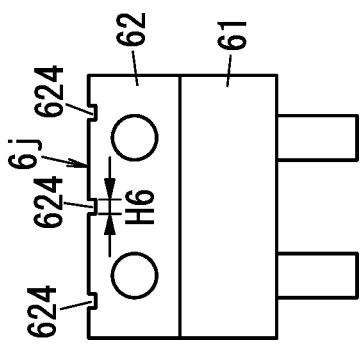
FIG. 21B is a side view illustrating a connection terminal used for the radio according to the fifth variation of the third embodiment.

A radio 800j according to a fifth variation of the third embodiment will be described below with reference to FIGS. 21A and 21B.

The radio 800j according to the fifth variation of the third embodiment is substantially the same as the radio 800e of the third embodiment but is different from the radio 800e of the third embodiment in that a connection terminal 6j is provided in place of the connection terminal 6. In the radio 800j according to the fifth variation of the third embodiment, components similar to those in the radio 800e of the third embodiment are denoted by the same reference signs as those in the third embodiment, and the description thereof is omitted.

The connection terminal 6j includes a through part 61 and a base part 62 in a similar manner to the connection terminal 6. The through part 61 extends through a through hole 29 formed in a substrate 2. The base part 62 is between the substrate 2 and a housing 801j. The connection terminal 6 includes the coaxial connector, whereas the connection terminal 6j includes, for example, a pin connector. The connection terminal 6j is electrically connected to the conductive device 1e. In the radio 800j, the conductive device 1e can be electrically connected to a component outside the conductive device 1e via the connection terminal 6j.

The base part 62 has a surface in which a groove 624 is provided and which is located opposite from the substrate 2 in a thickness direction D1 of the substrate 2. As illustrated in FIG. 21B, the base part 62 has a plurality of grooves 624. In the connection terminal 6j, the plurality of grooves 624 are aligned, for example, at regular intervals, but this should not be construed as limiting. Alternatively, the plurality of grooves 624 may be aligned, for example, at irregular intervals. Note that each of the plurality of grooves 624 has a straight-line shape. Moreover, each of the plurality of grooves 624 is a U-shaped groove in a cross-sectional view orthogonal to a length direction of the groove 624

The housing 801j is a film insert molded product in which the conductive device 1e serves as a film 81 in a similar manner to the housing 801e. The housing 801j is a resin structural component. The material for the housing 801j is, but not limited to, polycarbonate and may be, for example, an ABS resin or polystyrene.

Moreover, the radio 800j includes a wireless communication module in a similar manner to the radio 800e of the third embodiment.

In the radio 800j according to the fifth variation of the third embodiment, the connection terminal 6j can be suppressed from positionally displaced due to the pressure of the molding resin material, for example, during manufacturing. In the radio 800j according to the fifth variation of the third embodiment, the connection terminal 6j can be suppressed from positionally displaced due to the pressure of the molding resin material when a molding resin material flows as indicate by the arrow F2 shown in FIG. 16, for example, during manufacturing. Each of the plurality of grooves 624 preferably has, in its width direction, an opening width H6 of, for example, greater than or equal to 10 μm so that the molding resin material easily flows within the groove 624. Moreover, the opening width H6 is preferably, for example, less than or equal to 1 mm. The plurality of grooves 624 are formed through the entire length of the base part 62. Here, the plurality of grooves 624 are preferably formed over the entire length of the base part 62, that is, from a first end 6231 of an outer edge 623 of the base part 62 to a second end 6232 opposite from the first end 6231, the first end 6231 being an end from which the molding resin material flows.

The embodiments are mere examples of various embodiments of the present disclosure. Various modifications may be made to the embodiments depending on design and the like as long as the object of the present invention is achieved.

For example, in the method for producing the conductive device 1 according to the first embodiment, the method of applying the conductive paste 400 is not limited to the method using the dispenser system but may be, for example, a screen printing method.

Moreover, in the method for producing the conductive device 1 according to the first embodiment, the method of applying the conductive ink 500 is not limited to the method using the dispenser system but may be, for example, a screen printing method.

Moreover, the substrate 2 may have a lattice-like groove constituted by the plurality of grooves 20.

Moreover, the shape of the radiation conductor 103 in the antenna device 100 is not limited to the meander shape but may be other shapes. Further, the antenna device 100 is not limited to the dipole antenna but may be other antennas.

SUMMARY

A conductive device (1; 1a; 1b; 1c; 1d; 1e) of a first aspect includes a substrate (2; 2b) and an electrically conductive portion (3; 3b; 3c; 3d). The electrically conductive portion (3; 3b; 3c; 3d) is provided on the substrate (2; 2b). The electrically conductive portion (3; 3b; 3c; 3d) includes an electrically conductive part (4; 4b; 4c; 4d) and a low resistance conductive layer (5; 5b; 5c; 5d). The electrically conductive part (4; 4b; 4c; 4d) is provided on the substrate (2; 2b) and includes an electrically conductive particle (410) and an organic binder (420). The low resistance conductive layer (5; 5b; 5c; 5d) covers at least part of a surface (41; 41b; 41c; 41d) of the electrically conductive part (4; 4b; 4c; 4d) and has a lower resistivity than the electrically conductive part (4; 4b; 4c; 4d).

In the conductive device (1; 1a; 1b; 1c; 1d; 1e) of the first aspect, the resistivity of the electrically conductive portion (3; 3b; 3c; 3d) can be reduced.

In a conductive device (1; 1a; 1b; 1c; 1d; 1e) of a second aspect referring to the first aspect, the electrically conductive part (4; 4b; 4c; 4d) is stretchable.

In the conductive device (1; 1a; 1b; 1c; 1d; 1e) of the second aspect, the electrically conductive portion (3; 3b; 3c; 3d) can be suppressed from being broken when film insert molding of the conductive device (1; 1a; 1b; 1c; 1d; 1e) as a film is performed.

In a conductive device (1; 1a; 1b; 1c; 1d; 1e) of a third aspect referring to the first or second aspect, the substrate (2; 2b) is a flexible substrate.

The conductive device (1; 1a; 1b; 1c; 1d; 1e) of the third aspect can be disposed on not only a flat surface but also a curved surface, an uneven surface, and the like.

A conductive device (1; 1a; 1b; 1c; 1d; 1e) of a fourth aspect referring to any one of the first to third aspects further includes a protecting sheet (7). The protecting sheet (7) is stacked on the substrate (2; 2b) and covers the electrically conductive portion (3; 3b; 3c; 3d).

With the fourth aspect, the reliability of the conductive device (1; 1a; 1b; 1c; 1d; 1e) can be improved.

In a conductive device (1; 1a; 1b; 1c; 1d; 1e) of a fifth aspect referring to any one of the first to fourth aspects, the electrically conductive particle is a silver particle.

In a conductive device (1; 1a; 1b; 1c; 1d; 1e) of a sixth aspect referring to any one of the first to fifth aspects, the low resistance conductive layer (5; 5b; 5c; 5d) is a sintered silver layer including a plurality of silver nanoparticles.

In a conductive device (1; 1a; 1e) of a seventh aspect according to any one of the first to sixth aspects, the substrate (2) has a groove (23) overlapping the electrically conductive portion (3) in plan view in a thickness direction (D1) of the substrate (2), the groove (23) extending along an edge (33) of the electrically conductive portion (3). In the plan view in the thickness direction (D1) of the substrate (2), the edge (33) of the electrically conductive portion (3) overlaps an opening edge (231) which is one of a pair of opening edges (231, 232) in a width direction (D2) of the groove (23), the opening edge (231) being closer to the edge (33) of the electrically conductive portion (3). The electrically conductive portion (3) includes a projection portion (32) inserted in the grooves (23).

In the conductive device (1; 1a; 1e) of the seventh aspect, the shape accuracy of the electrically conductive portion (3) can be improved.

In a conductive device (1; 1a; 1b; 1e) of an eighth aspect referring to any one of the first to seventh aspects, the low resistance conductive layer (5; 5b; 5c) is stacked on an entirety of the surface (41; 41b; 41c) of the electrically conductive part (4; 4b; 4c).

With the conductive device (1; 1a; 1b; 1c; 1e) according to the eighth aspect, the resistance of the electrically conductive portion (3; 3b; 3c) can be reduced.

A method of a ninth aspect is a method for producing the conductive device (1; 1a; 1b; 1c; 1d; 1e) of any one of the first to eighth aspects. The method of the ninth aspect for producing the conductive device (1; 1a; 1b; 1c; 1d; 1e) includes: a substrate preparation step of preparing the substrate (2; 2b); an application step of applying conductive paste (400) to a formation target area of the electrically conductive part (4; 4b; 4c; 4d) on the substrate (2; 2b), the conductive paste (400) including the electrically conductive particle (410), the organic binder (420), and a solvent; a thermally curing step of heating the conductive paste (400) to form the electrically conductive part (4; 4b; 4c; 4d); and a low resistance conductive layer forming step of forming the low resistance conductive layer (5; 5b; 5c; 5d) on the surface (41; 41b; 41c; 41d) of the electrically conductive part (4; 4b; 4c; 4d).

The method for producing the ninth aspect of the conductive device (1; 1a; 1b; 1c; 1d; 1e) can reduce the resistance of the electrically conductive portion (3; 3b; 3c; 3d).

A radio (800; 800e; 800f; 800g; 800h; 800i; 800j) of a tenth aspect includes the conductive device (1; 1a; 1b; 1c; 1d; 1e) of any one of the first to eighth aspects as an antenna device (100; 100e).

In the radio (800; 800e; 800f; 800g; 800h; 800i; 800j) according to the tenth aspect, the resistance of the electrically conductive portion (3; 3b; 3c; 3d) can be reduced.

A radio (800; 800e; 800f; 800g; 800h; 800i; 800j) of an eleventh aspect referring to the tenth aspect further includes a housing (801; 801e; 800f; 801g; 801h; 801i; 801j). In the radio (800; 800e; 800f; 800g; 800h; 800i; 800j), the housing (801; 801e) and the conductive device (1; 1a; 1b; 1c; 1d; 1e) are integrated with each other.

With the eleventh aspect, the space in the radio (800; 800e; 800f; 800g; 800h; 800i; 800j) can be saved.

A radio (800e; 800f; 800g; 800h; 800i; 800j) of a twelfth aspect referring to the eleventh aspect further includes a connection terminal (6; 6f; 6g; 6h; 6i; 6j). The connection terminal (6; 6f; 6g; 6h; 6i; 6j) is electrically connected to the conductive device (1e). In the radio (800e; 800f; 800g; 800h; 800i; 800j), the conductive device (1e) is electrically connectable to a component outside the conductive device (1e) via the connection terminal (6; 6f; 6g; 6h; 6i; 6j).

In the radio (800e; 800f; 800g; 800h; 800i; 800j) of the twelfth aspect, conductive device (1e) can be easily electrically connected to the component outside the conductive device (1e).

In a radio (800e; 800f; 800g; 800h; 800i; 800j) of a thirteenth aspect referring to the twelfth aspect, the connection terminal (6; 6f; 6g; 6h; 6i; 6j) has a through part (61) and a base part (62). The through part (61) extends through the substrate (2) in a thickness direction (D1) of the substrate (2). The base part (62) is between the substrate (2) and the housing (801e; 800f; 800g; 800h; 800i; 800j).

In the radio (800e; 800f; 800g; 800h; 800i; 800j) according to the thirteenth aspect, the connection terminal (6; 6f; 6g; 6h; 6i; 6j) can be suppressed from being positionally displaced.

In a radio (800f; 800i) according to a fourteenth aspect referring to the thirteenth aspect, the base part (62) has an outer peripheral part (622), and at least part of the outer peripheral part (622) is thinner than a center part (621) of the base part (62).

In the radio (800f; 800i) of the fourteenth aspect, the connection terminal (6f; 6i) can be suppressed from being positionally displaced.

In a radio (800g; 800j) of a fifteenth aspect referring to the thirteenth aspect, the base part (62) has a groove (624) formed in a surface located on an opposite side from the substrate (2) in the thickness direction (D1) of the substrate (2).

In the radio (800g; 800j) of the fifteenth aspect, the connection terminal (6g; 6j) can be suppressed from being positionally displaced.

In a radio (800; 800e; 800f; 800g; 800h; 800i; 800j) according to a sixteenth aspect referring to any one of claims 11 to 15, the housing (801; 801e; 800f; 800g; 800h; 800i; 800j) is a film insert molded product including the conductive device (1; 1a; 1b; 1c; 1d; 1e) as a film.

In the radio (800; 800e; 800f; 800g; 800h; 800i; 800j) of the sixteenth aspect, the degree of freedom for disposition of the conductive device (1; 1a; 1b; 1c; 1d; 1e) with respect to the housing (801; 801e; 800f; 800g; 800h; 800i; 800j) is increased.

REFERENCE SIGNS LIST 1, 1a, 1b, 1c, 1d, 1e CONDUCTIVE DEVICE
2, 2b SUBSTRATE
23 GROOVE
231 OPENING EDGE
232 OPENING EDGE
3, 3b, 3c, 3d ELECTRICALLY CONDUCTIVE PORTION
32 PROJECTION PORTION
33, 33b EDGE
4, 4b, 4c, 4d ELECTRICALLY CONDUCTIVE PART
41, 41b, 41c, 41d SURFACE
400 CONDUCTIVE PASTE
410 ELECTRICALLY CONDUCTIVE PARTICLE
420 ORGANIC BINDER
5, 5b, 5c, 5d LOW RESISTANCE CONDUCTIVE LAYER
500 CONDUCTIVE INK
6, 6f, 6g, 6h, 6i, 6j CONNECTION TERMINAL
61 THROUGH PART
62 BASE PART
621 CENTER PART
622 OUTER PERIPHERAL PART
6221 TILTED SURFACE
624 GROOVE
7 PROTECTING SHEET
100, 100e ANTENNA DEVICE
800, 800e, 800f, 800g, 800h, 800i, 800j RADIO
801, 801e, 801f, 801g, 801h, 801i, 801j HOUSING
D1 THICKNESS DIRECTION
D2 WIDTH DIRECTION

The invention claimed is:
1. A conductive device, comprising:
a substrate; and
an electrically conductive portion provided on the substrate,
the electrically conductive portion including:
an electrically conductive part provided on the substrate and including an electrically conductive particle and an organic binder; and
a low resistance conductive layer covering at least part of a surface of the electrically conductive part and having a lower resistivity than the electrically conductive part,
wherein the low resistance conductive layer is a sintered silver layer including a plurality of silver nanoparticles.
2. The conductive device of claim 1 wherein
the electrically conductive part is stretchable.
3. The conductive device of claim 1, wherein
the substrate is a flexible substrate.
4. The conductive device of claim 1, further comprising a protecting sheet stacked on the substrate and covering the electrically conductive portion.
5. The conductive device of any one of claim 1, wherein
the electrically conductive particle is a silver particle.
6. The conductive device of claim 1, wherein
the substrate has a groove overlapping the electrically conductive portion in plan view in a thickness direction of the substrate, the groove extending along an edge of the electrically conductive portion, and
in the plan view in the thickness direction of the substrate, the edge of the electrically conductive portion overlaps one opening edge of a pair of opening edges in a width direction of the groove, the one opening edge being closer to the edge of the electrically conductive portion, and
the electrically conductive portion includes a projection portion inserted in the grooves.

7. The conductive device of claim 1, wherein
the low resistance conductive layer is stacked on an entirety of the surface of the electrically conductive part.

8. A method for producing the conductive device of claim 7, the method comprising:
preparing the substrate;
applying conductive paste to a formation target area of the electrically conductive part on the substrate, the conductive paste including the electrically conductive particle, the organic binder, and a solvent;
heating the conductive paste to form the electrically conductive part; and
forming the low resistance conductive layer on the surface of the electrically conductive part.

9. A radio comprising a conductive device as an antenna device,
the conductive device comprising:
a substrate; and
an electrically conductive portion provided on the substrate,
the electrically conductive portion including:
an electrically conductive part provided on the substrate and including an electrically conductive particle and an organic binder; and
a low resistance conductive layer covering at least part of a surface of the electrically conductive part and having a lower resistivity than the electrically conductive part,
wherein the low resistance conductive layer is a sintered silver layer including a plurality of silver nanoparticles.

10. The radio of claim 9, further comprising a housing, wherein
the housing and the conductive device are integrated with each other.

11. The radio of claim 10 further comprising a connection terminal electrically connected to the conductive device, wherein
the conductive device is electrically connectable to a component outside the conductive device via the connection terminal.

12. The radio of claim 10, wherein
the housing is a film insert molded product including the conductive device as a film.

13. A radio comprising:
a conductive device as an antenna device;
a housing; and
a connection terminal electrically connected to the conductive device, the conductive device comprising:
a substrate; and
an electrically conductive portion provided on the substrate, the electrically conductive portion including:
an electrically conductive part provided on the substrate and including an electrically conductive particle and an organic binder; and
a low resistance conductive layer covering at least part of a surface of the electrically conductive part and having a lower resistivity than the electrically conductive part,
wherein the housing and the conductive device are integrated with each other,
the conductive device is electrically connectable to a component outside the conductive device via the connection terminal, and
the connection terminal has:
a through part extending through the substrate in a thickness direction of the substrates; and
a base part between the substrate and the housing.

14. The radio of claim 13, wherein
the base part has an outer peripheral part, and at least part of the outer peripheral part is thinner than a center part of the base part.

15. The radio of claim 13, wherein
the base part has a groove formed in a surface located on an opposite side from the substrate in the thickness direction of the substrate.

* * * * *